United States Patent [19]

Komori et al.

[11] Patent Number: 4,972,371

[45] Date of Patent: Nov. 20, 1990

[54] SEMICONDUCTOR MEMORY DEVICE

[75] Inventors: Kazuhiro Komori, Kodaira; Takaaki Hagiwara; Satoshi Meguro, both of Hinode; Toshiaki Nishimoto, Tama; Takeshi Wada, Akishima; Kiyofumi Uchibori, Hachioji; Tadashi Muto, Tachikawa; Hitoshi Kume, Musashino; Hideaki Yamamoto, Tokorozawa; Tetsuo Adachi, Hachioji; Toshihisa Tsukada, Musashino; Toshiko Koizumi, Kokubunji, all of Japan

[73] Assignee: Hitachi, Ltd., Tokyo, Japan

[21] Appl. No.: 203,456

[22] Filed: Jun. 7, 1988

[30] Foreign Application Priority Data

Jun. 8, 1987 [JP] Japan .................................. 62-141486
Sep. 18, 1987 [JP] Japan .................................. 62-234187

[51] Int. Cl.⁵ .............................................. G11C 11/34
[52] U.S. Cl. .................................... 365/185; 365/182; 357/23.5
[58] Field of Search .................... 365/189.01, 185, 218, 365/174, 182; 357/23.5, 23.6

[56] References Cited

U.S. PATENT DOCUMENTS 4,531,203 7/1985 Masuoka et al. ..................... 365/218
4,665,418 5/1987 Mizutani .............................. 357/23.5
4,835,740 5/1989 Sato ...................................... 365/185

FOREIGN PATENT DOCUMENTS 62-276878 1/1987 Japan .

OTHER PUBLICATIONS

IEDM Technical Digest 1985, pp. 616-619, "A Single Transistor EEPROM Cell and Its Implementation in a 512K CMOS EEPROM", by Mukherjee et al.

Primary Examiner—James W. Moffitt
Attorney, Agent, or Firm—Antonelli, Terry, Stout & Kraus

[57] ABSTRACT

An EEPROM in which a memory cell is constituted by a floating gate electrode, a control gate electrode, a first semiconductor region provided in a main surface portion of the semiconductor substrate on an end side of the gate electrodes to which the data line is connected, and a second semiconductor region provided in a different main surface portion of the semiconductor substrate on an opposing end side of the gate electrodes to which the grounding line is connected. The drain is used differently depending upon the operations for writing the data, reading the data and erasing the data. The impurity concentration in the first semiconductor region is selected to be lower than that of the second semiconductor region, in order to improve writing and erasing characteristics as well as to increase the reading speed.

56 Claims, 16 Drawing Sheets

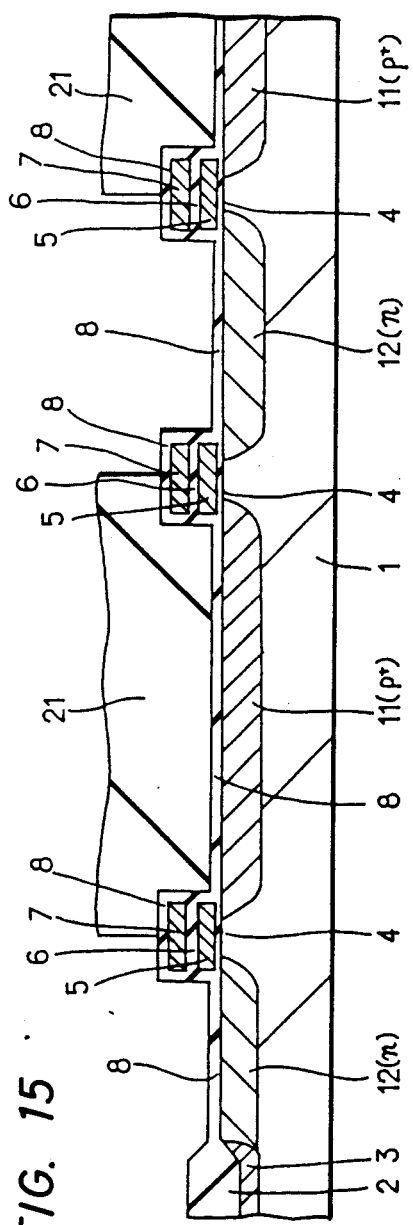
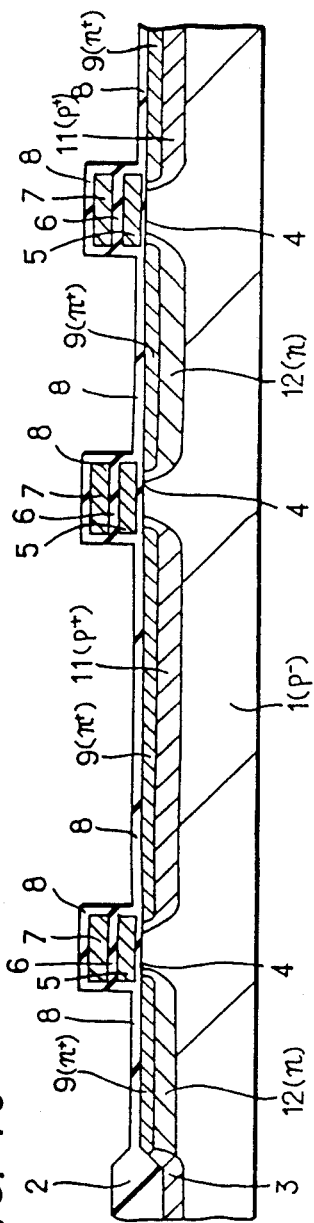
FIG. 15
FIG. 16

SEMICONDUCTOR MEMORY DEVICE

BACKGROUND OF THE INVENTION

The present invention relates to a semiconductor memory device and, more particularly, to a semiconductor memory device in which a memory cell consists of a MISFET (metal insulated semiconductor field effect transistor) which has a floating gate electrode and a control gate electrode, and in which the data is written by injecting carriers into the floating gate electrode.

One type of non-volatile memory is an EEPROM (electrically erasable and programmable ROM, and wherein the memory thereof can be constituted by cells therefor which include a single MISFET that has a floating gate electrode and a control gate electrode as has been disclosed in the IEDM Technical Digest, 1985, pp. 616–617. In this memory cell, the data is written by applying a voltage of 12.5 volts to the control gate electrode, a voltage of 8 volts to the drain and a voltage of zero volt to the source, such that a drain current of, for example, about 500 μA flows to generate hot electrons at the drain end that will be injected to the floating gate electrode. The data, on the other hand, is erased by applying a voltage of 12.5 volts to the source and a voltage of zero volt to the drain and to the control gate electrode, so that the electrons in the floating gate electrode are emitted into the substrate.

It is, however, a recent trend to employ only one power source for the semiconductor memory device, i.e., to employ a power source of, for instance, 5 volts only instead of employing a plurality of power sources to supply power to a semiconductor chip. Therefore, high voltages such as of 12.5 volts and 8 volts are obtainable by booster circuits provided in the semiconductor chip. However, booster circuit which consists of a diode and a capacitor requires an increased area when it is designed to provide an increased current capacity. Usually, however, the booster circuit is designed to have a current capacity of about 100 μA. Therefore, the drain current is not sufficient enough for effectively writing the data, and good writing characteristics are not obtainable.

To erase the data, furthermore, a voltage of as high as 12.5 volts must be applied to the source. However, the breakdown voltage is small between the source and the substrate, and a large leakage current flows into the substrate thereby making it difficult to apply a voltage of as high as 12.5 volts to the source.

There was earlier proposed by some of the applicants of the present application, a semiconductor memory device in connection with U.S. application Ser. No. 053,730, which is commonly assigned, in which a p+-type layer was formed in contact with the drain so as to surround the drain to improve writing characteristics, and an n-type layer was formed on the outside of the n+-type layer to increase the junction breakdown voltage between the source and the substrate. By forming the drain in the p+-type layer, as described above, the electric field is intensified at an end on the channel side of the drain when the data is being written, and whereby hot electrons are generated highly efficiently contributing to improving the writing characteristics. With reference to the source, on the other hand, the avalanche breakdown voltage thereof is increased relative to the substrate, and the data is erased by applying a voltage which is as high as about 12.5 volts maintaining improved erasing characteristics.

SUMMARY OF THE INVENTION

The present applicants, however, have further discovered the fact that the following problems arise with such a semiconductor memory device in which the drain is formed in the p+-type layer such as that described above, in connection with the above-said U.S. application, when the data is written by the injection of hot electrons generated at the drain end into the floating gate and when the data is erased by tunnel-emitting the electrons to the source.

That is, since the drain is formed in contact with the p+-type layer, a minimum voltage that is required (threshold voltage) at a control gate of the EEPROM memory cell storage transistor for forming a channel between the drain region and the source region to render it conductive tends to increase. Furthermore, a junction capacitance is imparted to the drain which, furthermore, causes the speed for reading the data to decrease.

The breakdown voltage, on the other hand, is increased between the source and the substrate. However, if the gate oxide film under the floating gate is reduced to a thickness of smaller than 100 angstroms in order to increase the erasing speed thereof, the application of an erasing voltage of, for example, 12.5 volts results in a leakage current of about $10^{-9}$ A per each memory cell. When a memory having a memory capacity of, for example, one megabits is to be erased at one time, the leakage current resulting at the time of erasing, therefore, can become as great as $10^{-3}$ A; i.e., it is difficult to erase the data relying upon a booster circuit in the semiconductor chip. As the threshold voltage Vth of, the memory cell drops near to a value Vth which is just below the thermal equilibrium condition (condition in which the floating gate electrode remains electrically neutral) as the erasing operation progressing along the injection hot holes from the semiconductor substrate to the floating gate electrode becomes noticeable in addition to the Fowler-Nordheim tunnel emission of electrons from the floating gate electrode to the source region, and as a result thereof, there is a loss in the controllability and reliability during the erasing operation.

This condition will now be described briefly with reference to FIGS. 25 to 27.

FIGS. 25 and 26 are section views of a memory cell which is constituted by a MISFET consisting of a p-type semiconductor substrate 1, a tunnel oxide film 2, a floating gate electrode 3, an interlayer insulating film 4, a control gate electrode 5, an n+-type semiconductor region (part of the source region) 6, an n+-type semiconductor region (drain region) 7, and an n--type semiconductor region (part of the source region) 8. The electrons are tunnel-emitted as designated at 9 from the floating gate electrode 3 to the source region 6 when a high voltage Vs of positive polarity is applied to the source region 6 under the condition where the control gate electrode 5, drain region 7 and p-type semiconductor substrate 1 are grounded, and whereby the erasing operation is carried out.

The electrons of a large quantity are held in the floating gate electrode 3 during the initial stage of erasing, and the channel current does not flow even when a high voltage is applied to the source region 6.

As the erasing proceeds as shown in FIG. 27 and the floating gate electrode 3 approaches the electrically neutral condition, however, a channel current 10 starts to flow being affected by the capacitive coupling between the source region 6 and the floating gate electrode 3. The channel current 10, can cause avalanching in the high electric field region at the end of the source region wherein hot holes which are thereby generated, as designated at 11, are partly injected into the tunnel oxide film 2.

Injection of hot holes seriously deteriorates the quality of the tunnel oxide film such as accelerating the generation of surface level, and presents a serious problem with regard to the number of times the writing operation can be satisfactorily effected and in the reliability in the erasing operation.

The injected hot holes are held in the floating gate electrode wherein they elevate the potential. Therefore, the erasing operation proceeds with the Fowler-Nordheim tunnel-emission of electrons. In this case, the erasing speed is drastically accelerated (portion designated at 12) as shown in FIG. 27, and it therefore becomes quite difficult to control the threshold voltage Vth.

The object of the present invention is to provide technology wherein there is an increase in the data reading speed in a memory cell consisting of a MISFET which has a floating gate electrode and a control gate electrode, and in which a gate oxide film consists of a thin tunnel oxide film.

Another object of the present invention is to improve the writing characteristics in the memory cell.

A further object of the present invention is to provide technology which makes it possible to perform good writing and erasing operation using a booster circuit in a semiconductor chip in the memory cell.

Still a further object of the present invention is to provide an electric erasing system which erases the written data effectively and at the same time maintaining high reliability without permitting the erasing characteristics to deteriorate.

The above and further objects as well as novel features of the present invention will become apparent from the description of the specification and the accompanying drawings.

Along the improved aspects of the invention disclosed herein, a representative example will be described below briefly.

That is, a semiconductor memory device in which a memory cell consists of a MISFET having a floating gate electrode and a control gate electrode, and in which the data is written by injecting electrons from the side of the substrate into the floating gate electrode via the gate insulating film, wherein the data is written by applying a predetermined high potential to a second semiconductor region to which a grounding line is connected, applying a predetermined low potential to a first semiconductor region to which a data line is connected and applying a predetermined high potential to a control gate electrode, the data is erased by applying a predetermined high potential to the first semiconductor region to which the data line is connected, applying a predetermined low potential to the second semiconductor region to which the grounding line is connected and applying a predetermined low potential to the control gate electrode, and the data is read out by applying a predetermined potential to the control gate electrode while using the first semiconductor region to which the data line is connected as a drain and using the second semiconductor region to which the grounding line is connected as a source.

Further, the second semiconductor region to which the grounding line is connected is provided with a semiconductor region of the opposite type of conductivity at least at an end portion thereof on the channel side, and the first semiconductor region to which the data line is connected has a double structure consisting of a semiconductor region of a high impurity concentration formed in a semiconductor region of a low impurity concentration. According to the aforementioned device, the junction capacitance decreases between the substrate and the first semiconductor region to which the data line is connected, enabling the data reading speed to be increased.

The data is written by applying a predetermined voltage to the grounding line. Here, since adjacent to the second semiconductor region to which the grounding line is connected there is provided a semiconductor region of the opposite conductivity type therewith at an end portion thereof on the channel side, the depletion layer is prevented from being extended, and more electrons become generated than when the second semiconductor region is not provided with an adjacent further semiconductor region of the opposite type of conductivity therewith at the end portion thereof on the channel side, thus contributing to improving the writing characteristics.

Further, the data is erased for each of the data memory cells at one time. Therefore, the leakage current decreases, and the data is erased with a voltage produced by a booster circuit contained in the semiconductor chip.

In writing the data, furthermore, a predetermined high potential is applied to the second semiconductor region which is adjacently provided with an additional semiconductor region of an opposite type of conductivity therewith at an end portion thereof on the channel side. Therefore, the hot electrons are generated efficiently making it possible to lower the writing voltage; i.e., the data can be written using the booster circuit in the semiconductor chip.

In erasing the data, a predetermined high potential is applied to the first semiconductor region of a double structure which double structure is a layer of a high impurity concentration which is formed in a layer of a low impurity concentration. Therefore, the corresponding avalanche breakdown voltage associated therewith increases relative to the substrate, and whereby it is allowed to apply a high potential and, hence, to improve the erasing characteristics utilizing the tunnel effect.

BRIEF DESCRIPTION OF THE DRAWINGS

FIGS. 7 to 20 are section views illustrating the steps for fabricating the memory cells of the first embodiment of the present invention;

DESCRIPTION OF THE PREFERRED EMBODIMENTS

A first embodiment of the invention will now be described.

The circuit structure of a memory cell array will be described first with reference to FIG. 1 which is a circuit diagram of the memory cell array of an EEPROM.

Figure 1:
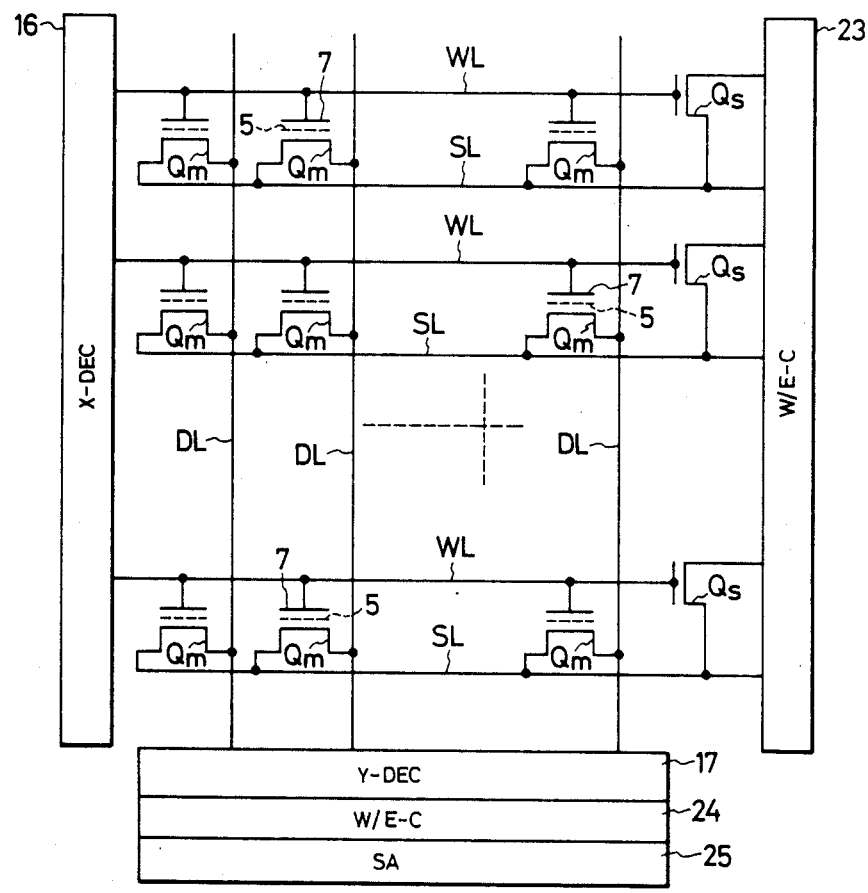
FIG. 1 is a diagram of an equivalent circuit of a memory cell array in an EEPROM.

In FIG. 1, reference numeral 16 denotes an X-decoder, 17 denotes a Y-decoder, 23 denotes a write/erase control circuit, 24 denotes a write/erase circuit, and 25 denotes a sense amplifier. Word lines WL extend from the X-decoder 16 and data lines DL extend from the Y-decoder 17. Symbol Qm denotes a memory cell which consists of a MISFET that has a floating gate electrode 5 and a control gate electrode 7. The memory cells Qm are respectively arranged at the intersecting portions locations of the word lines WL and the data lines DL, and are connected as shown. Symbol SL denotes grounding lines that extend in the same direction as the word lines WL. Symbol Qs denotes a source MISFET for applying a writing voltage, and which applies a voltage Vcc of, for example, 5 volts to the grounding line when the data is to be written.

In the EEPROM of one megabit, memory cells Qm of, for example, 1024 bits are connected to a single data line DL.

Next, the data reading operation and the data writing operation of the memory cell Qm will be described in conjunction with FIG. 2, and the data erasing operation will be described in conjunction with FIGS. 2, 3 and 4.

Figure 2:
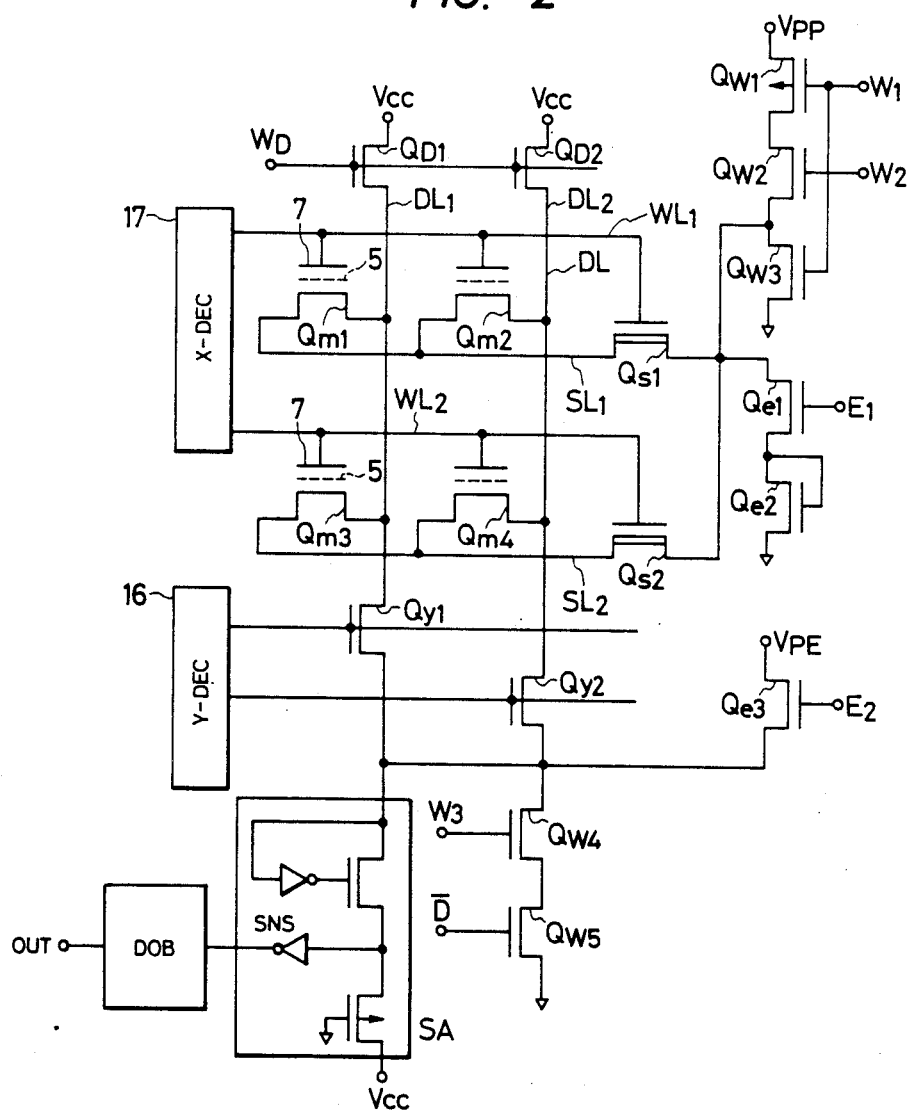
FIGS. 2 and 4 are diagrams for explaining the operation for writing data onto a memory cell, operation for reading the data and operation for erasing the data.
Figure 3:
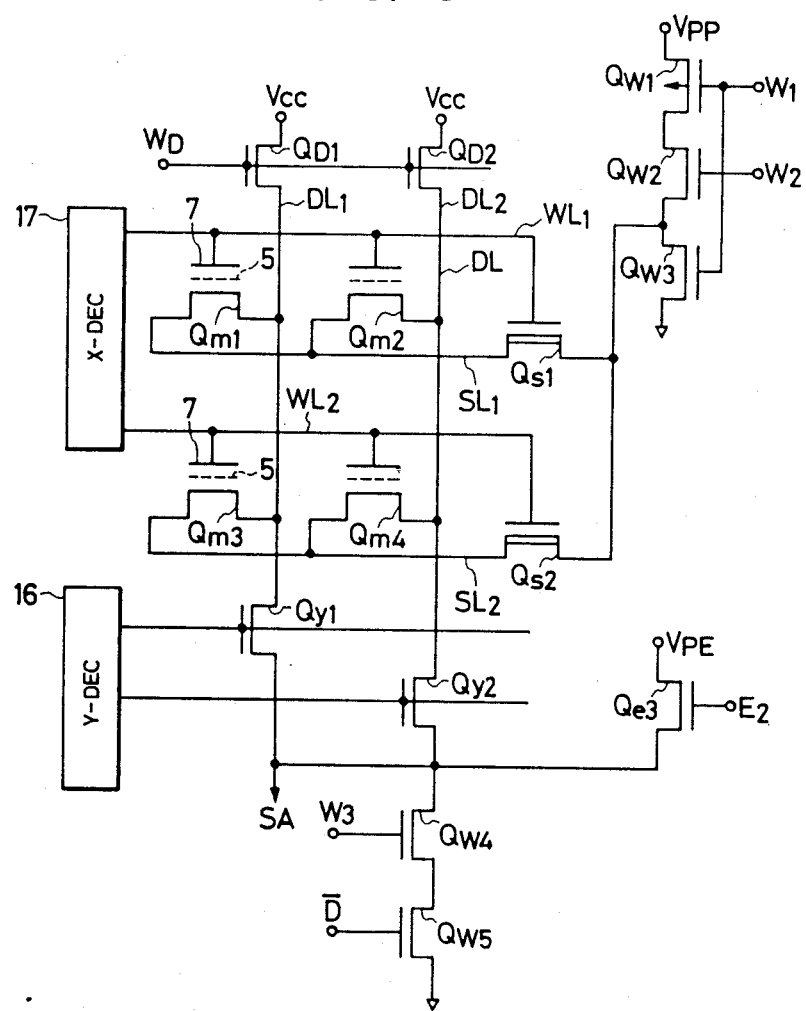
Figure 4:
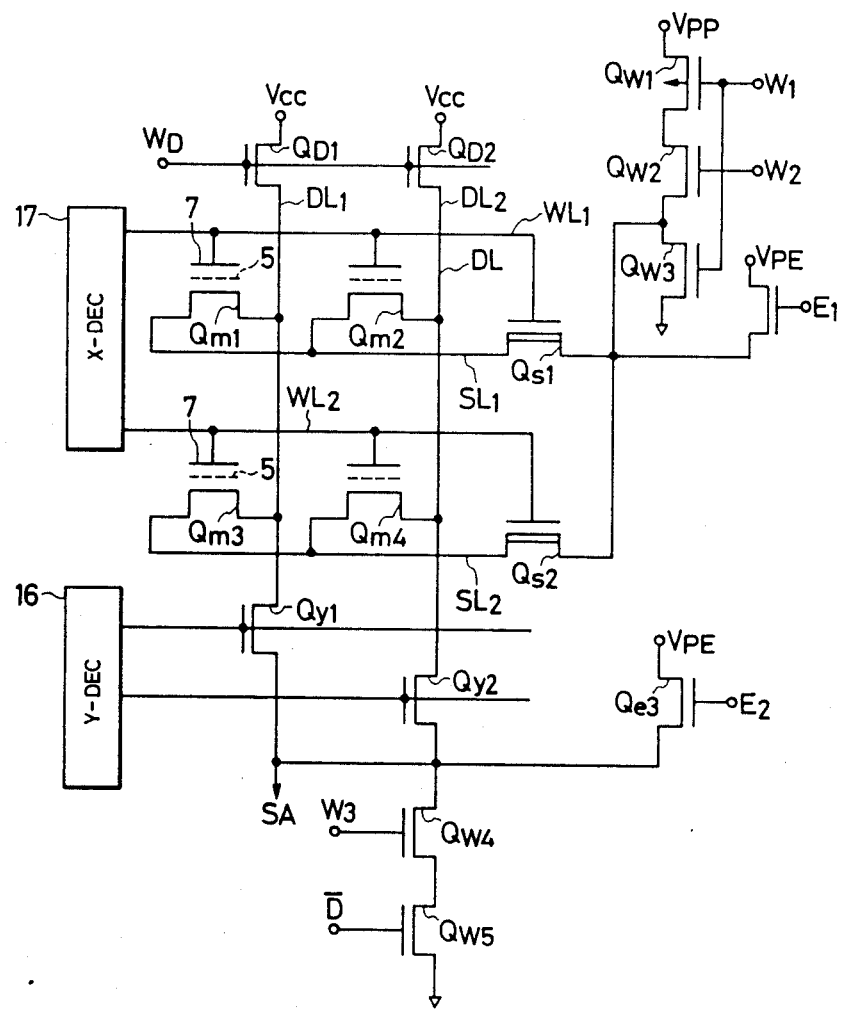

FIG. 2 is a diagram for explaining the data reading operation, writing operation and erasing operation of the memory cell Qm, and FIGS. 3 and 4 are diagrams which illustrate other erasing operations and wherein only four memory cells Qm are diagramed.

In FIG. 2, symbol $Q_{w1}$ denotes a p-channel MISFET, and symbols $Q_{D1}$, $Q_{D2}$, $Q_{w2}$, $Q_{w3}$, $Q_{w4}$, $Q_{w5}$, $Q_{e1}$, $Q_{e2}$, $Q_{e3}$, $Q_{y1}$, $Q_{y2}$ denote n-channel MISFETs. The MISFETs $Q_{w1}$, $Q_{w2}$, $Q_{w3}$, $Q_{e1}$ and $Q_{e2}$ are provided in the write/erase control circuit 23, and the MISFET's $Q_{e3}$, $Q_{y1}$, $Q_{y2}$, $Q_{w4}$ and $Q_{w5}$ are provided in the write/erase circuit 24. Symbols $Q_{s1}$ and $Q_{s2}$ denote n-channel MISFET's of the depletion mode type. Symbols $V_{CC}$, $V_{PP}$, $V_{PE}$, $W_1$, $W_2$, $W_3$, $E_1$, $E_2$ and $\overline{D}$ denote terminals. A data input signal is applied to the terminal $\overline{D}$ when the data is to be written.

In the following description, the operation is explained based on the assumption that the memory cell $Q_{m1}$ is selected by the X-decoder 17 and the Y-decoder 16 among the four memory cells $Q_{m1}$ to $Q_{m4}$, and the other memory cells $Q_{m2}$ to $Q_{m4}$ are not selected.

[Reading Operation]

A power source voltage of, for example, 5 volts is applied to the terminals $V_{CC}$, $V_{PP}$ and $V_{PE}$. The X-decoder 17 applies a voltage of, for example, 5 volts to the word line $WL_1$ and a voltage of, for example, 0 volt to the word line $WL_2$. Further, the Y-decoder 16 renders the MISFET $Q_{y1}$ to be conductive and the MISFET $Q_{y2}$ to be nonconductive. The terminal $W_D$ assumes 0 volt, the terminals $W_1$ to $W_3$ assume a voltage of, for example, 5 volts, and the terminals $E_1$ and $E_2$ assume zero volt. Therefore, the transistors MISFET $Q_{D1}$, MISFET $Q_{D2}$, and MISFET $Q_{w1}$ are rendered nonconductive, the transistors MISFET $Q_{w2}$, $Q_{w3}$ and $Q_{w4}$ are rendered conductive, and the transistors MISFET $Q_{e1}$ and $Q_{e3}$ are turned off. When the data is to be read out, the terminal $\overline{D}$ assumes 0 volt, and MISFET $Q_{w5}$ remains nonconductive. Here, since the transistors MISFET $Q_{s1}$ and $Q_{w3}$ are conductive, the grounding line $SL_1$ assumes a voltage of, for example, 0 volt. The sense amplifier SA detects the potential that changes depending upon the data written onto the memory cell $Q_{m1}$.

[Writing Operation]

A voltage of, for example, 5 volts is applied to the terminal $V_{PP}$. A boosted voltage of, for example, 12.5 volts is applied from the X-decoder 17 to the word line $WL_1$, and a voltage of, for example, zero volt is applied to the word line $WL_2$. The Y-decoder 16 renders the MISFET $Q_{y1}$ conductive and MISFET $Q_{y2}$ nonconductive. The terminal $W_D$ assumes, for example, 5 volts, the terminal $W_1$ assumes, for example, 0 volt, the terminal $W_2$ assumes, for example, 12.5 volts, the terminal $W_3$ assumes, for example, 5 volts, and the terminals $E_1$ and $E_2$ assume, for example, 0 volt. Therefore, the transistors MISFET $Q_{D1}$, $Q_{D2}$ and MISFET $Q_{w1}$, $Q_{w2}$ are rendered conductive, and MISFET $Q_{w3}$ is rendered nonconductive. The transistors MISFET $Q_{e1}$ and $Q_{e3}$ remain nonconductive, respectively. The transistor MISFET $Q_{w4}$ is conductive, and VCC is 5 volts. Here, to write the data, a data input signal of, for example, 5 volts is applied to the data input terminal $\overline{D}$ to render the transistor MISFET $Q_{w5}$ conductive. In this case, since the transistors MISFET $Q_{y1}$ and $Q_{w4}$ are rendered conductive, only the data line $DL_1$ assumes a voltage of, for example, 0 volt among all of the data lines DL. On the other hand, since the word line $WL_1$ is assuming, for example, 12.5 volts, the transistor MISFET $Q_{s1}$ is rendered conductive, and a voltage of, for example, 5 volts is applied to the grounding line $SL_1$ through the transistors MISFET $Q_{w1}$, $Q_{w2}$ and $Q_{s1}$. In writing the data onto the memory cell $Q_{m1}$, therefore, an electric current flows from the drain (source when the data is to be read out) to the source (drain when the data is to be read out), and the data is written. To the data line $DL_2$ is applied a voltage of, for example, 3.5 volts since the transistor MISFET $Q_{D2}$ is conductive and $Q_{y2}$ is nonconductive. Therefore, the non-selected data lines are never turned on during the writing operation, and the data is never erroneously written onto the non-selected memory cell $Q_{m2}$.

[Erasing Operation]

First, the operation for erasing the data from the memory cell $Q_m$ will be described with reference to FIG. 2.

A predetermined boosted potential, for example, 12.5 volts is applied to the terminal $V_{PE}$. All of the word lines $WL_1$, $WL_2$ are rendered to assume a voltage of, for example, 0 volt by the X-decoder 17. The Y-decoder 16 applies a voltage of, for example, 12.5 volts to the gate electrode of the MISFET $Q_{y1}$, and applies a voltage of, for example, 0 volt to the gate electrode of the MISFET $Q_{y2}$. A voltage of, for example, 5 volts is applied to the terminals $V_{PP}$ and $V_{CC}$, and a voltage of 0 volt is applied to the terminals $W_D$ and $W_1$ to $W_3$. Further, a voltage of, for example, 5 volt is applied to the terminal $E_1$ and a voltage of, for example, 12.5 volts is applied to the terminal $E_2$. In this case, the transistors MISFET $Q_{w4}$ and $Q_{w5}$ are rendered nonconductive. Between the transistors MISFET $Q_{y1}$ and $Q_{y2}$, furthermore, the transistor $Q_{y1}$ only is turned on, and a predetermined high potential of, for example, 12.5 volts is applied to the data line $DL_1$ only of the data lines $DL_1$ and $DL_2$, and the data are erased from the memory cells $Q_{m1}$ and $Q_{m3}$ only, since they are connected to the data line $DL_1$. Further, the data are erased from the memory cells $Q_{m2}$ and $Q_{m4}$ connected to the other data line $DL_2$ in the same manner as described above, by selecting the transistor MISFET $Q_{y2}$ by the Y-decoder 16. To simultaneously erase the data from the memory cells $Q_{m1}$ to $Q_{m4}$, however, the transistors MISFET $Q_{y1}$ and $Q_{y2}$ are simultaneously selected by the Y-decoder 16. In the foregoing description, the terminal $V_{PP}$ is impressed with the voltage of, for example, 5 volts which is the same as the voltage impressed to the terminal $V_{CC}$, and a voltage boosted by the internal circuit is used as a high voltage for writing and erasing the data. It is, of course, allowable to apply a voltage from the external unit. In this case, the terminal $V_{PP}$ is impressed with a voltage of, for example, 12.5 volts.

The erasing system described below may also be employed to suppress at a low level the injection of hot holes into the floating gate electrode, the hot holes being generated as the erasing operation progresses. That is, in a circuit shown in FIG. 3, a voltage of, for example, 12.5 volts is applied to the terminal $V_{PE}$ to the gate electrode of MISFET $Q_{y1}$, and a voltage of 0 volt is applied to the gate electrode of MISFET $Q_{y2}$ like in the erasing system described with reference to FIG. 2. Further, a voltage of, for example, 5 volts is applied to the terminals $V_{PP}$ and $V_{CC}$, and a voltage of zero volt is applied to the terminals $W_D$ and $W_1$ to $W_3$. As the voltage of, for example, 12.5 volts is applied to the terminal $E_2$, furthermore, a predetermined high potential of, for example, 12.5 volts is applied to the data line $DL_1$, and whereby the data are erased from the memory cells $Q_{m1}$ and $Q_{m3}$. In this case, the transistors MISFET $Q_{w2}$ and $Q_{w3}$ are rendered nonconductive; i.e., the grounding line SL connected thereto and the semiconductor region of the side connected to the grounding line SL are all floating during this time. Then, the potential in the drain region is raised by the channel current that flows as the erasing operation continues, so that the channel current decreases. Therefore, the injection of hot holes is suppressed at a low level despite the fact that the erasing operation is continuing: i.e., erasing characteristics are improved.

As shown in FIG. 4, furthermore, the same erasing potential $V_{PE}$ may be applied from both the data line DL and the grounding line under the condition where the transistors MISFET $Q_{y1}$ and $Q_{y2}$ are both rendered conductive. In this case, no channel current flows even if the erasing operation is still in progress, and as a result thereof the occurrence of undesired phenomena can be avoided, i.e., generation and injection of hot holes is prevented.

Described below is the structure of the memory cell according to the first embodiment.

Figure 5:
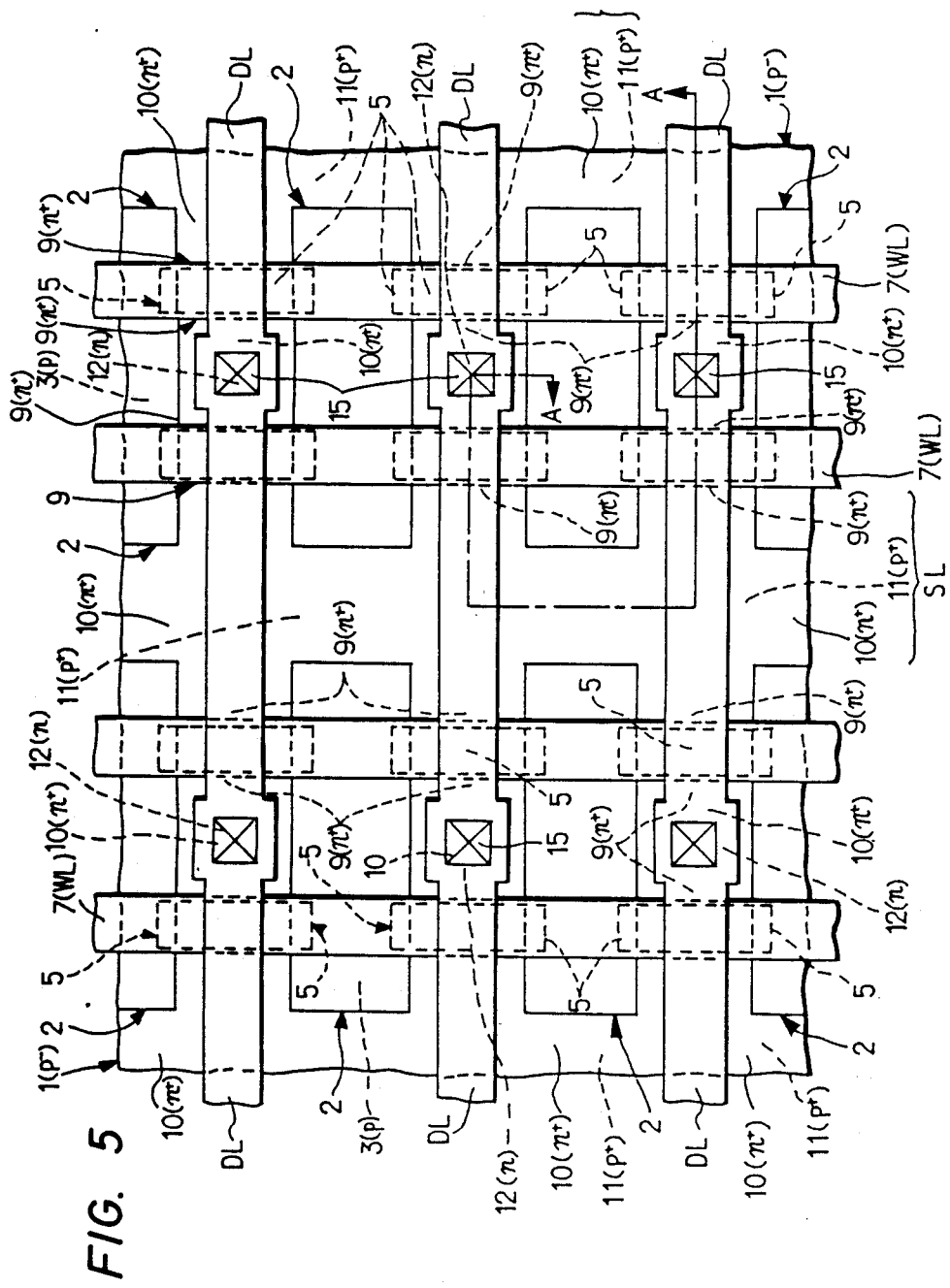
FIG. 5 is a plan view illustrating a portion of the memory cell array according to a first embodiment of the present invention.
Figure 6:
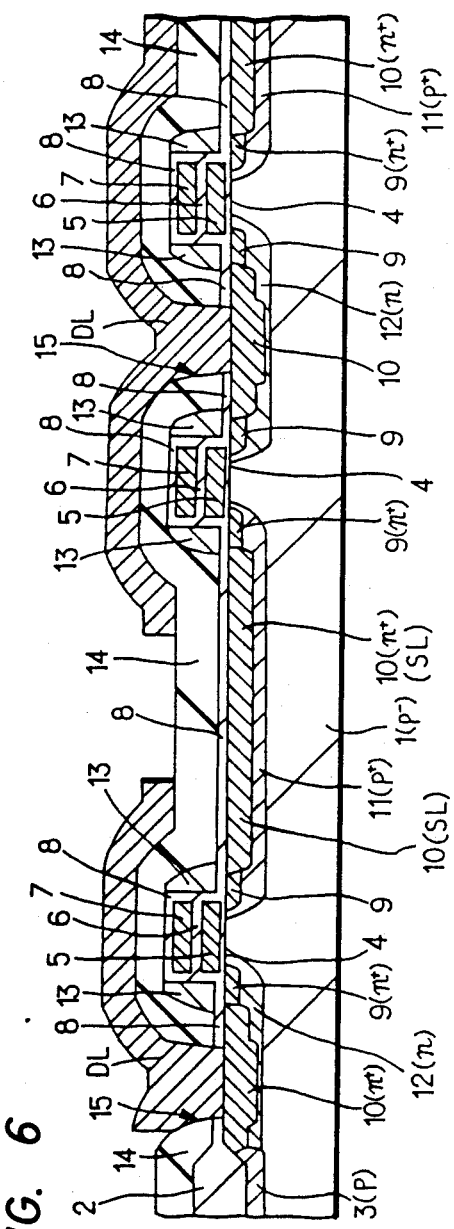
FIG. 6 is a section view along the line A—A of FIG. 5.

FIG. 5 is a plan view illustrating a portion of the memory cell array, and FIG. 6 is a section view along the line A—A of FIG. 5. For easy comprehension of the structure of the memory cell, furthermore, FIG. 5 does not show the insulating films other than the field insulating film.

In FIGS. 5 and 6, reference numeral 1 denotes a substrate composed of a single crystalline silicon, 2 denotes a field insulating film, and 3 denotes a p-type channel stopper.

A MISFET which constitutes a memory cell consists of a first gate insulating film 4 having a thickness of about 100 angstroms, a floating gate electrode 5, a second gate insulating film 6 having a thickness of about 250 angstroms, a control gate electrode 7, an n+-type semiconductor region 9 that serves as a source or a drain, an n+-type semiconductor region 10, and an n-type semiconductor region 12. The first gate insulating film 4 is composed of a silicon oxide film obtained by thermally oxidizing the surface of, for example, the semiconductor substrate 1. The floating gate electrode 5 is composed of, for example, a polycrystalline silicon film. The second gate insulating film 6 consists of a silicon oxide film obtained by thermally oxidizing the surface of the polycrystalline silicon film which forms the floating gate electrode 5, and has a thickness of about 250 to 350 angstroms. The control gate 7 is a double-layer film obtained by laminating a silicide film of a refractory metal such as $WSi_2$ on, for example, a polycrystalline silicon film. Further, the control gate electrode 7 is formed together with the word line WL as a unitary structure.

Among the n+-type semiconductor regions 9 and 10 on both sides of the gate electrodes 5 and 7, those n+-type semiconductor regions 9 and 10 to which the data line DL is connected through a contact hole 15 have their ends that are defined by the gate electrodes 5 and 7 in a direction in which the data line DL extends, or that are defined by a side wall 13 which consists of a silicon oxide film. The ends in a direction in which the word line WL extends are defined by the field insulating film 2. The n+-type semiconductor regions 9 and 10 under the contact hole 15 are divided for each of the contact holes 15. Further, the n+-type semiconductor regions 9 and 10 under the contact hole 15 are further provided in the n-type semiconductor region (semiconductor region of a low impurity concentration) 12. Like the above-mentioned n+-type semiconductor regions 9 and 10, therefore the n-type semiconductor region 12 is also provided for each of the regions surrounded by the gate electrodes 5, 7 and the field insulating film 2 on both sides of the contact hole 15. The n+-type semiconductor regions 9, 10 and the n-type semiconductor region 12 to which the data line DL is connected serve as a drain at the time of reading and erasing the data, and serve as a source at the time of writing the data. Moreover, the n+-type semiconductor region 10 and the n-type semiconductor region 12 are commonly possessed by two memory cells that are connected to the same data line DL through a single contact hole 15. The n+-type semiconductor region 9 is provided at both ends of the n+-type semiconductor region 10 to which the data line DL is connected so as to extend under the floating gate electrodes 5 of the two memory cells. The length of the n+-type semiconductor region 9 in the lengthwise direction of the channel is defined by the side wall 13.

The n+-type semiconductor regions 9 and 10 of the gate electrodes 5 and 7 of the side opposite to the side to which the data line DL is connected, serve as a source when the data is to be read out, and serve as a drain when the data is to be written. To erase the data, a predetermined low potential, such as, zero volt is applied, but they are not used as a source. Between the n+-type semiconductor regions 9 and 10 that serve as a source when the data is to be read out, the n+-type semiconductor region 9 is formed under the side wall 13 for each of the memory cells, and slightly extends under the floating gate electrode 5. The n+-type semiconductor region 10 extends in a direction in which the word line WL extends on the surface of the substrate 1 and is used for a plurality of memory cells arranged along both sides thereof. The grounding line SL is constituted by the n+-type semiconductor region 10 that extends in the same direction as the word line WL and by the n+-type semiconductor region 9 formed under the side wall 13. The p+-type semiconductor region 11 is so formed as to surround the periphery and bottom of the n+-type semiconductor regions 9 and 10 that constitute the grounding line SL. Therefore, the p+-type semiconductor region 11 extends in a direction in which the word line WL extends. However, the p+-type semiconductor region 11 need not necessarily be provided under the whole bottom area of the n+-type semiconductor regions 9 and 10, but may be provided at an end of the n+-type semiconductor region 9 on the channel side.

The depth from the upper surface to the bottom of the n+-type semiconductor region 9 (hereinafter referred to as junction depth) is about 0.1 to 0.2 μm, the junction depth of the n+-type semiconductor region 10 is about 0.2 to 0.3 μm, and the junction depths of the n-type semiconductor region 12 and the p+-type semiconductor region 11 are about 0.4 to 0.6 μm.

The surface of the semiconductor substrate 1 exposed over the field insulating film 2 and the floating gate electrode 5, side surfaces of the floating gate electrode 5, and side surfaces and upper surface of the control gate electrode 7, are coated with a thin silicon oxide film 8. Reference numeral 14 denotes an interlayer insulating film constituted by laminating a phosphorus silicate glass (PSG) on, for example, a silicon oxide film, and the data line DL is composed of an aluminum film.

From the standpoint of reducing the junction capacitance between the drain and the substrate 1 at the time of reading the data, the drain at the time of reading operation may be constituted by the n-type semiconductor region 12 only. The n+-type semiconductor regions 9 and 10 that constitute the grounding line SL are formed in the p+-type semiconductor region 11. However, it is also possible to constitute the grounding line SL by the n+-type semiconductor regions 9 and 10 only without providing the p+-type semiconductor region 11. In the first embodiment, however, the p+-type semiconductor region 11 is provided in order to increase the efficiency for writing the data.

Accordingly, memory cells of the following three types can be constituted.

According to the memory cell of the first type, the semiconductor region to which the data line DL is connected is constituted by the n-type semiconductor region 12 alone, i.e., the drain during the reading operation is constituted by the n-type semiconductor region 12 alone. On the other hand, there is provided no p+-type semiconductor region 11 to surround the n+-type semiconductor regions 9 and 10 that constitute the grounding line SL.

According to the memory cell of the second type, the drain at the time of reading the data is constituted by the n+-type semiconductor regions 9 and 10, and there is provided no n-type semiconductor region 12. Further, a p+-type semiconductor region 11 is provided to surround the n+-type semiconductor regions 9 and 10 that constitute the grounding line SL.

According to the memory cell of the third type, the drain at the time of reading the data is constituted by the n-type semiconductor region 12 alone, and the p+-type semiconductor region 11 is provided to surround the n+-type semiconductor region 9 and 10 that constitute the grounding line SL.

The memory cell structure shown in FIGS. 3 and 4 can be adapted not only to the EEPROM but to the EPROM as well. In the EPROM, the data is erased by irradiating the channel region of the memory cell with ultraviolet rays.

The memory cell of the structure described above offers the effects as mentioned below.

First, described below are the effects exhibited by the memory cell having the structure of the first type.

That is, there is provided a semiconductor memory device in which a memory cell consists of a MISFET which is constituted by a floating gate electrode 5 and a control gate electrode formed on a substrate 1 in a superposed manner, a first semiconductor region (n-type layer 12) provided, in a principal surface region of the semiconductor substrate on an end side of the gate electrodes 5, 7 to which is connected a data line DL, and a second semiconductor region (comprised of n+-type layers 9 and 10) formed in another portion of the principal surface region on an opposing end side of the gate electrodes 5, 7 to which the grounding line SL is connected, the MISFET being arranged at the intersecting portions of the data lines DL and the word lines WL, and wherein the first semiconductor region (n-type layer 12) is connected to the data line DL, the second semiconductor region (n+-type layers 9 and 10) is connected to the grounding line SL, and the control gate electrode 7 is connected to the word line WL. The impurity concentration in the first semiconductor region (n-type layer 12) is set to be lower than that of the second semiconductor region (n+-type layers 9, 10). To write the data, a predetermined high potential of, for example, 5 volts is applied to the second semiconductor region (n+-type layers 9, 10) to which the grounding line SL is connected, a predetermined low potential (e.g., 0 volt) is applied to the first semiconductor region (n-type layer 12) to which the data line DL is connected, and a predetermined high potential of, for example, 12.5 volts is applied to the control gate electrode 7. To read the data, a predetermined potential of, for example, 5 volts is applied to the control gate electrode 7 using the first semiconductor region (n-type layer 12) to which the data line DL is connected as a drain and using the second semiconductor region (n+-type layers 9, 10) to which the grounding line SL is connected as a source. Therefore, the electric field becomes strong at an end of the drain constituted by the n+-type semiconductor regions 9 and 10 during the writing operation, i.e., the electric field becomes strong at an end on the channel side of the grounding line SL compared with that of the case where the drain during the writing operation is constituted by the n-type layer like in the semiconductor region on the side of the data line. Accordingly, the hot electrons are generated efficiently to enhance the writing characteristics. Furthermore, the drain, i.e, the n-type semiconductor region 12 during the reading operation is connected to the data line DL to reduce the capacity of the data line, making it possible to increase the reading speed.

Described below are the effects exhibited by the memory cell having the structure of the second type.

That is, there is provided a semiconductor memory device in which a memory cell consists of a MISFET which is constituted by a floating gate electrode 5 and a control gate electrode 7 formed on a substrate 1 in a superposed manner, a first semiconductor region (comprised of n+-type layers 9 and 10) provided in a principal surface region of the substrate 1 on an end side of the gate electrodes 5, 7 to which is connected the data line DL, and a second semiconductor region (comprised of n+-type layers 9 and 10) formed in another portion of the principal surface of substrate 1 on an opposing end side of the gate electrodes 5, 7 to which the grounding line SL is connected, the MISFET being arranged at the intersecting portions of the data lines DL and the word lines WL, and wherein the first semiconductor region (n+-type layers 9, 10) is connected to the data line DL, the second semiconductor region (n+-type layers 9, 10) is connected to the grounding line SL, and the control gate electrode 7 is connected to the word line WL. Further, a third semiconductor region (p+-type layer 11) is provided at an end of the second semiconductor region (n+-type layers 9, 10) on the channel side, the third semiconductor region (p+-type layer 11) having a conductivity type opposite to that of the first and second semiconductor regions. To write the data, a predetermined high potential of, for example, 5 volts is applied to the second semiconductor region (n+-type layers 9, 10) to which the grounding line SL is connected, a predetermined low potential (e.g., 0 volt) is applied to the first semiconductor region (n+-type layers 9, 10) to which the data line DL is connected, and a predetermined high potential of, for example, 12.5 volts is applied to the control gate electrode 7. To read the data, a predetermined potential of, for example, 5 volts is applied to the control gate electrode 7 using the first semiconductor region (n+-type layers 9, 10) as a drain and using the second semiconductor regions (n+-type layers 9, 10) to which the grounding line SL is connected as a source. Therefore, the electric field becomes very strong at an end of the drain, i.e., becomes stronger at an end of the region which is closer to channel side of that region connected to the grounding line SL during the writing operation than that of when the p+-type layer 11 is not provided, enabling the writing characteristics to be improved. Furthermore, since the p+-type layer 11 is not contacted to the drain during the reading operation, the junction capacitance decreases relative to the substrate 1, and the reading speed can be increased.

Next, described below are the effects exhibited by the memory cell having the structure of the third type.

That is, there is provided a semiconductor memory device in which a memory cell consists of a MISFET which is constituted by a floating gate electrode 5 and a control gate electrode 7 formed on a substrate 1 in a superposed manner, a first semiconductor region provided on and end side of the gate electrodes to which is connected the data line DL of the gate electrodes 5, 7 on the surface of the substrate 1, and a second semiconductor region (comprised of n+-type layers 9 and 10) formed on an opposing end side to which the grounding line SL is connected, the MISFET being arranged at the intersecting portions of the data lines DL and the word lines WL, and wherein the first semiconductor region (n-type layer 12) is connected to the data line DL, the second semiconductor region (n+-type layers 9, 10) is connected to the grounding line SL, and the control gate electrode 7 is connected to the word line WL. Further, a third semiconductor region (p+-type layer 11) is provided at the end of the second semiconductor region (n+-type layers 9, 10) on the channel side thereof the third semiconductor region (p+-type layer 11) having a conductivity type opposite to that of the first and second semiconductor regions. To write the data, a predetermined high potential of, for example, 5 volts is applied to the second semiconductor region n+-type layers 9, 10) to which the grounding line SL is connected, a predetermined low potential (e.g., 0 volt) is applied to the first semiconductor region (n-type layer 12) to which the data line DL is connected, and a predetermined high potential of, for example, 12.5 volts is applied to the control gate electrode 7. To read the data, a predetermined potential of, for example, 5 volts is applied to the control gate electrode 7 using the first semiconductor region.(n-type layer 12) as a drain and using the second semiconductor region (n+-type layers 9, 10) to which the grounding line SL is connected as a source. Therefore, the electric field becomes very strong at an end of the drain, i.e., becomes stronger at an end of the region which is closer to the channel side of that region connected to the grounding line SL during the writing operation than that of when the p+-type layer 11 is not provided, thereby enabling the writing characteristics to be improved. Furthermore, since the junction capacitance becomes small between the substrate 1 and the drain, i.e., the n-type semiconductor region 12 during the reading operation, the reading speed can be increased.

Next, described below are the effects other than the aforementioned effects exhibited by the memory cells of the first to third types.

The data are erased for every data line DL or for every plural data lines DL by applying a predetermined high potential of, for example, 12.5 volts to the n-type semiconductor region 12 (or n+-type layers 9, 10) of each of the plurality of memory cells to which the data lines DL are connected. Therefore, the leakage current flows in reduced amounts into the substrate 1 during the one time of erasing operation, and the data can be erased by the booster circuit contained in the semiconductor chip.

To erase the data, furthermore, the data line DL is selected by the Y-decoder, and the erasing voltage is applied to a plurality of memory cells to which the data line is connected. Therefore, there is no need of using a source line decoder for selecting the source line that is required when the data is to be erased by the source line, and the chip size does not increase.

Moreover, the data is erased by placing the second semiconductor region under the floating condition which is provided in a main surface portion of the semiconductor substrate on the end side of the gate electrodes opposite to the side where the data line is connected and by applying a high voltage Vs of positive polarity to the first semiconductor region provided in a main surface portion of the semiconductor substrate on the end side of the electrodes where the data line is connected. Therefore, the potential at the floating gate electrode rises as the erasing operation progresses, and the steady channel current does not flow even when the erasing operation proceeds up to the state where an inverted channel is just formed under the floating gate electrode. Therefore, the hot holes are not generated or injected that would be caused by the channel current. Namely, the erasing speed is prevented from increasing rapidly, and the erasing operation is realized while maintaining high controllability. Furthermore, since the tunnel oxide film is not deteriorated by the injection of hot holes, it becomes possible to thereby realize the erasing operation and with respect maintaining excellent reliability in regard to the number of rewritable times that can be effected.

The semiconductor region to which a predetermined high voltage is applied during the erasing operation is an n-type semiconductor region 12 having a low impurity concentration. Therefore, the junction breakdown voltage increases relative to the substrate 1, and the leakage current decreases per each memory cell.

Furthermore, since the $n^+$-type semiconductor regions 9 and 10 are provided in the n-type semiconductor region 12, the resistance of the drain can be decreased at the time of reading the data and the reading speed can be increased. In the EEPROM, furthermore, the speed for erasing the data can be increased, too.

Moreover, since the $n^+$-type semiconductor region 9 having a shallow junction depth is provided at an end on the channel side of the $n^+$-type semiconductor region 10 on both sides of the gate electrode 5, 7, the $n^+$-type semiconductor region 9 extends slightly under the floating gate electrode 5, and the capacitance decreases with respect to the floating gate electrode 5. This contributes to increasing the reading speed.

Since the $n^+$-type semiconductor region 10 having a deep junction depth is provided for both the drain and the grounding line SL during the reading operation, the drain and the grounding line SL exhibit decreased resistance. This makes it possible to increase the speeds for writing the data, reading the data and erasing the data.

Described below is a method of fabricating the memory cell illustrated in FIGS. 5 and 6.

FIGS. 7 to 20 are section views and plan views illustrating the steps for fabricating the same portions as those of the memory cell of FIG. 6.

Figure 7:
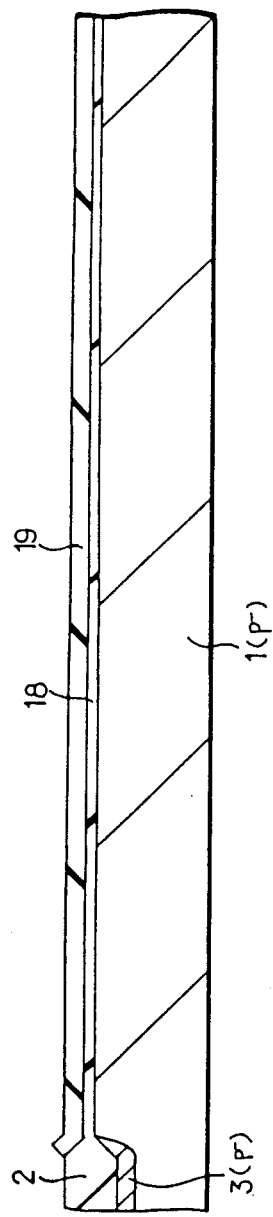

As shown in FIG. 7, first, a silicon oxide film 18 is formed by oxidizing a $p^-$-type semiconductor substrate 1, and a silicon nitride film 19 is selectively formed thereon by CVD. Using the silicon nitride film 19 as a mask, a predetermined surface of the semiconductor substrate 1 is thermally oxidized to form a field insulating film 2. A $p^-$-type channel stopper 3 is formed in advance by implanting p-type impurities such as boron ions using the silicon nitride film 19 as a mask prior to forming the field insulating film 2. After the field insulating film 2 is formed, the silicon nitride film 19 and the silicon oxide film 18 are removed.

Figure 8:
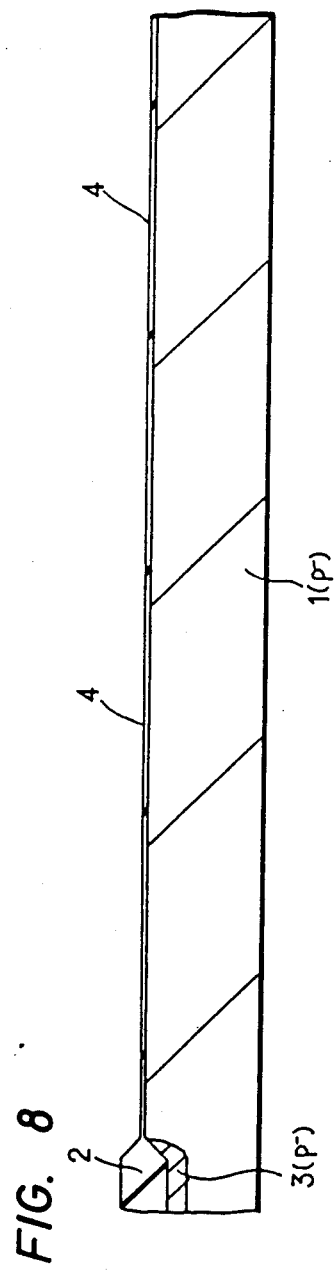

With reference to FIG. 8, next, the surface exposed over the field insulating film 2 of the substrate 1 is thermally oxidized to form a first gate insulating film 4 having a thickness of about 100 angstroms.

Figure 9:
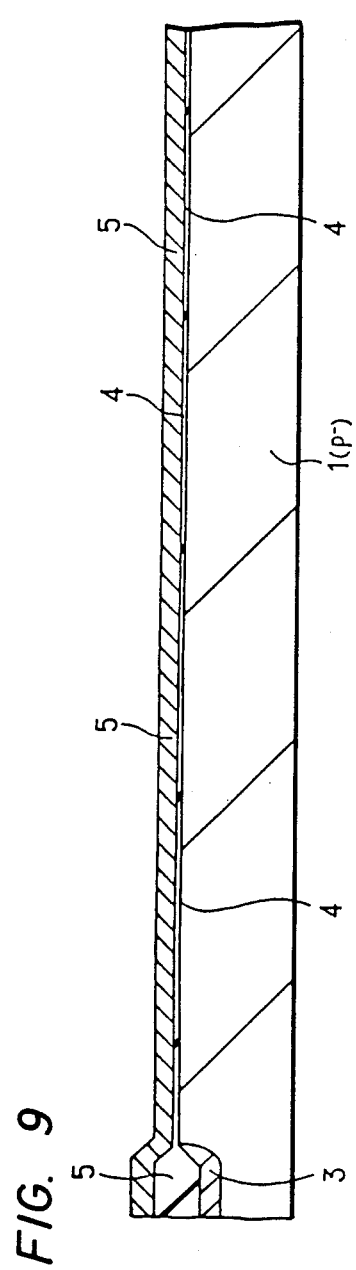

With reference to FIG. 9, a polycrystalline silicon film 5 is formed by CVD on the whole surface of the semiconductor substrate 1 to form a floating gate electrode 5. N-type impurities such as phosphorus ions are introduced by thermal diffusion or ion implantation into the polycrystalline silicon film 5 in order to decrease its resistance.

Figure 10:
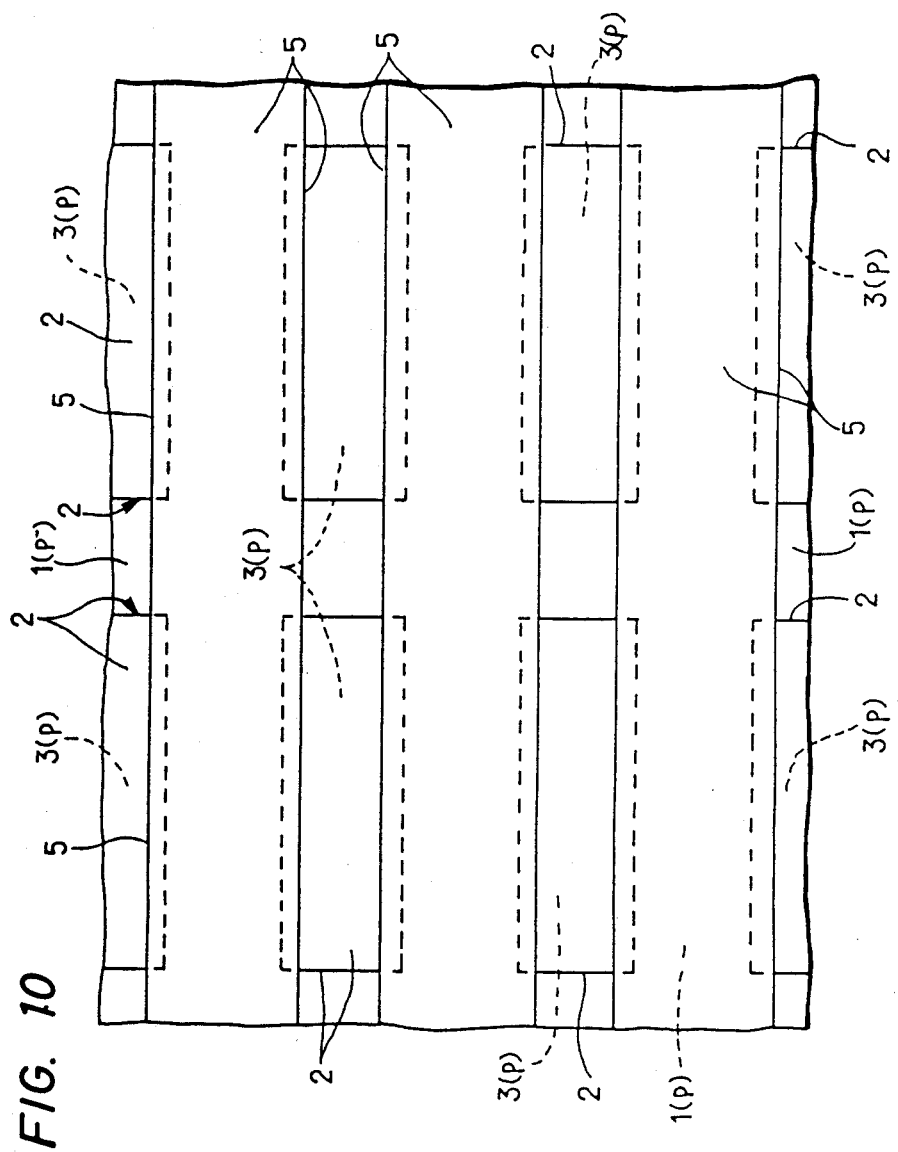

With reference to FIG. 10, the polycrystalline silicon film 5 is subjected to the patterning by etching using a resist film (not shown) as a mask, such that floating gate electrodes 5 extend in a direction in which the data line DL extends maintaining a predetermined distance. That is, in this step of etching, the polycrystalline silicon film 5 is patterned to form a floating gate electrode 5 of a unitary form for a plurality of memory cells that are connected to the same data line DL. After the polycrystalline silicon film 5 is patterned, the mask composed of the resist film is removed.

Figure 11:
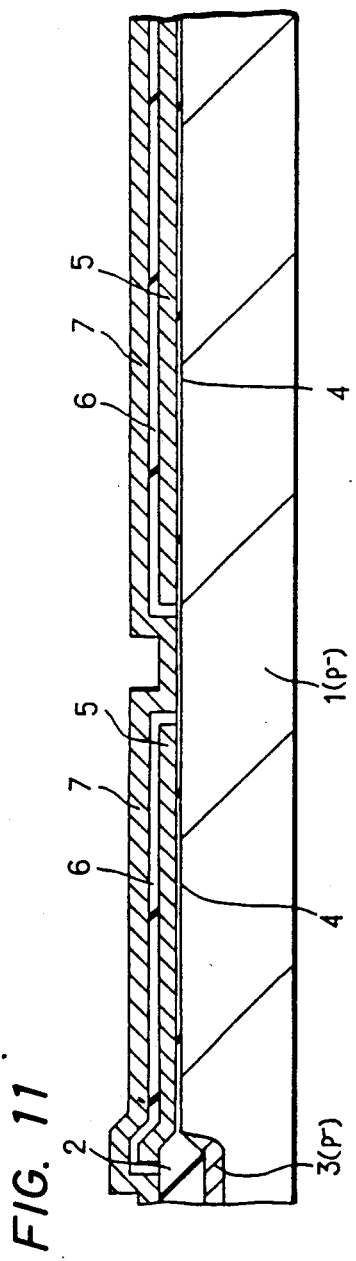

Then, with reference to FIG. 11, the surface of the polycrystalline silicon film 5 is oxidized to form a second gate insulating film which is composed of a silicon oxide film having a thickness of about 200 to 250 angstroms. In this step of oxidation, there is formed a gate insulating film of a MISFET that constitutes a peripheral circuit. Next, a polycrystalline silicon film 7 is formed by, for example, CVD on the whole surface of the semiconductor substrate 1 in order to form a control gate electrode 7 and a word line WL. N-type impurities such as phosphorus ions are introduced by thermal diffusion or ion implantation to the polycrystalline silicon film 7 to decrease its resistance.

Figure 12:
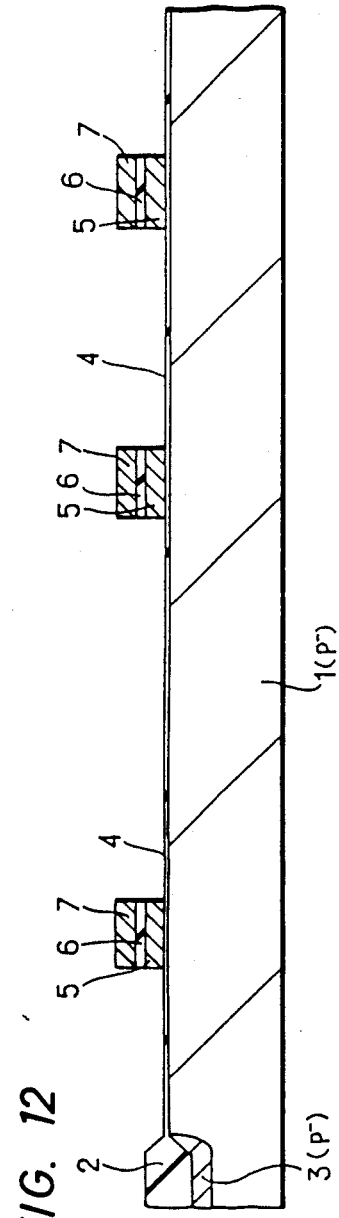

With reference to FIG. 12, the polycrystalline silicon film 7 is subjected to the etching using a mask which consists of a resist film (not shown) in order to form the control gate electrode 7 and the word line WL. In this step of etching is formed a gate electrode for the MISFET that constitutes a peripheral circuit. Subsequent to the above etching, the second gate insulating film 6 exposed over the floating gate electrode 7 is subjected to the etching. Moreover, the polycrystalline silicon film 5 is subjected to the etching to form the floating gate electrode 5. After a series of etchings, the mask composed of the resist film is removed. The control gate electrode 7, word line WL, and gate electrode of MISFET that constitutes the peripheral circuit, are composed of a refractory metal film such as of molybdenum, tungsten, tantalum or titanium, or a silicide film thereof, or are composed of a double-layer film obtained by laminating the above-mentioned refractory metal film or the silicide film thereof on a polycrystalline silicon film.

Figure 13:
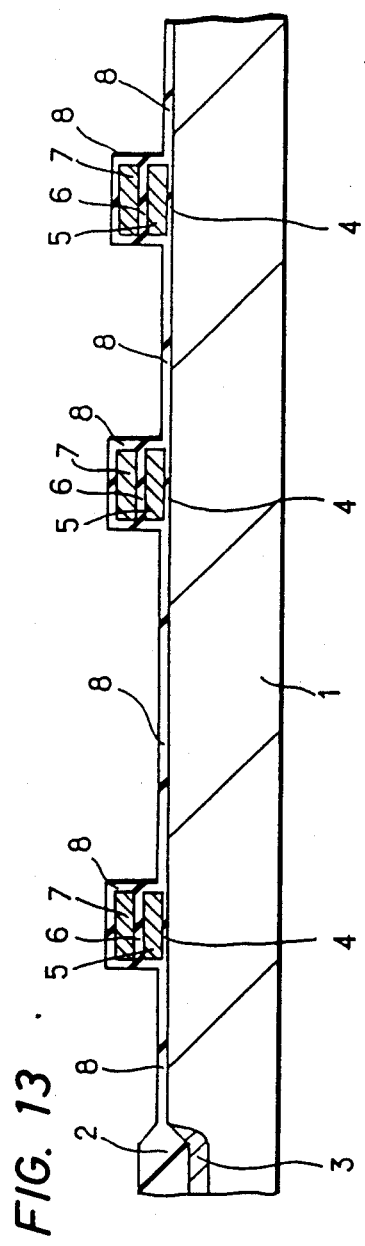

With reference to FIG. 13, the surface on which the floating gate electrode 5 and the control gate electrode 7 (word line WL) are exposed, is thermally oxidized to form a silicon oxide film 8. Due to the oxidation, the surface of the semiconductor substrate 1 exposed over the floating gate electrode 5 and the control gate electrode 7, is oxidized to form the silicon oxide film 8.

Figure 14:
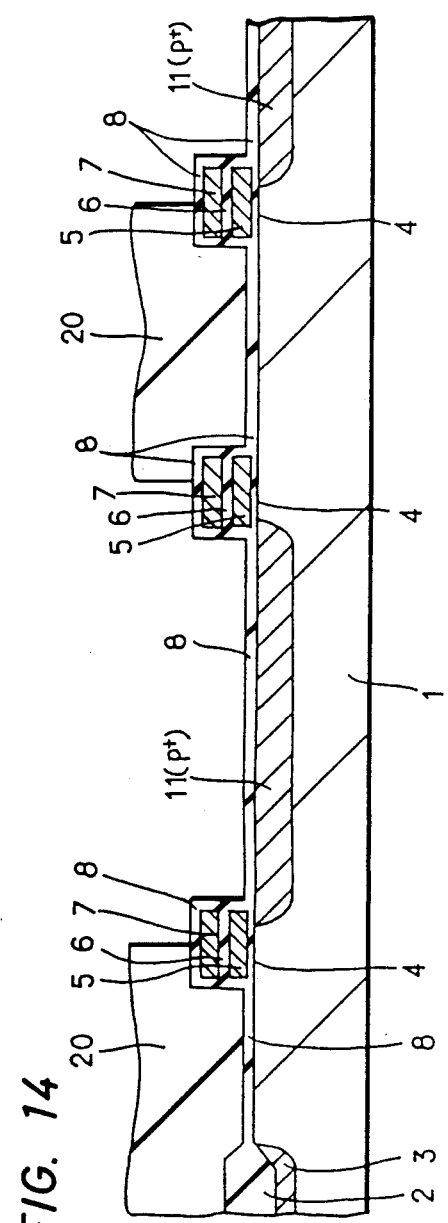

With reference to FIG. 14, a mask 20 composed of a resist film is formed on the semiconductor substrate 1 to form a $p^+$-type semiconductor region 11. Next, p-type impurities such as boron ions are introduced by ion implantation into the surface of the semiconductor substrate 1 maintaining a concentration of about $10^{13}$ to atoms/cm$^2$. After the mask 20 is removed, the impurities are diffused by annealing to a junction depth of about 0.4 to 0.6 $\mu$m, thereby to form the $p^+$-type semiconductor region 11.

With reference to FIG. 15, a mask 21 composed of a resist film is formed on the substrate 1 to form an n-type semiconductor region 12. Then, n-type impurities such as phosphorus ions are introduced by ion implantation to the surface of the substrate 1 in a dosage of about $10^{14}$ atoms/cm$^2$. Then, the mask 20 is removed, and the impurities are diffused by annealing to a depth of 0.4 to 0.6 $\mu$m thereby to from the n-type semiconductor region 12.

With reference to FIG. 16, an $n^+$-type semiconductor region 9 is formed by introducing n-type impurities such as arsenic ions by ion implantation in a dosage of about $10^{15}$ to $10^{16}$ atoms/cm$^2$ into the surface of the semiconductor substrate 1 using the floating gate electrode 5 and control gate electrode 7 as a mask. At the time of ion implantation, the peripheral circuit region is covered with a mask composed of a resist film, and ions are implanted into the memory cell region only. Furthermore, the memory cell region is covered with a mask which consists of a resist film, and n-type impurities such as phosphorus ions are implanted into the peripheral circuit region in a dosage of about $1 \times 10^{13}$ atoms/cm$^2$, thereby to form the source and drain regions of the MISFET that constitutes the peripheral circuit in an LDD (lightly doped drain) structure. The mask composed of resist film provided on the peripheral circuit region is removed after the ion implantation.

Figure 17:
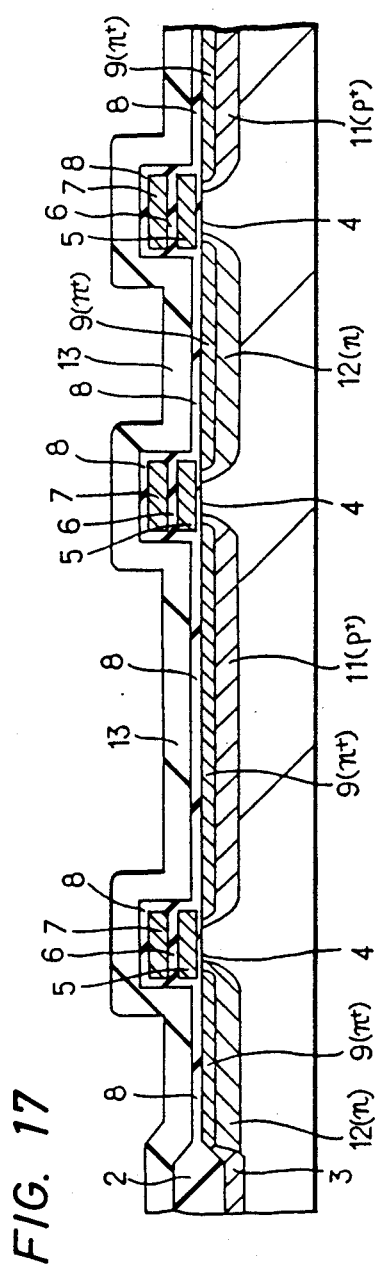

With reference to FIG. 17, a silicon oxide film 13 is formed by, for example, CVD on the whole surface of the semiconductor substrate 1 so as to form side walls.

Figure 18:
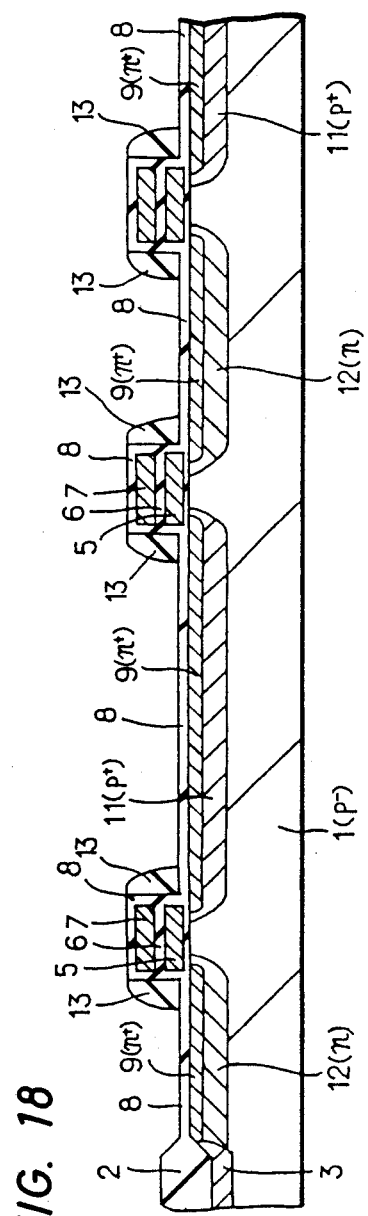

With reference to FIG. 18, the silicon oxide film is removed by reactive ion etching (RIE) until the surface of the semiconductor substrate 1 is exposed, thereby to form side walls 13. The side wall 13 is also formed by the side of the gate electrode of MISFET that constitutes the peripheral circuit. The surface of the semiconductor substrate 1 exposed by etching is oxidized again to form a silicon oxide film 8.

Figures 19, 20:
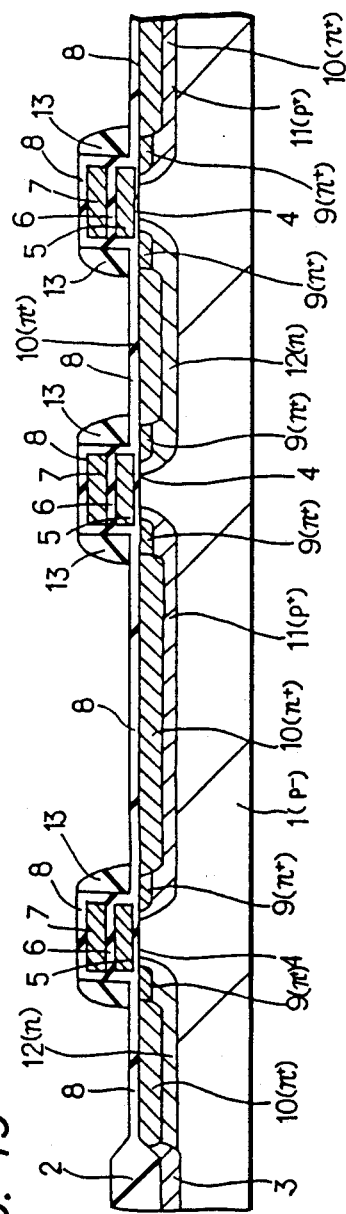

With reference to FIG. 19, n-type impurities such as arsenic ions are introduced in a dosage of about $5 \times 10^{15}$ to $1 \times 10^{16}$ atoms/cm$^2$ using the floating gate electrode 5, control gate electrode 7 and side walls 13 as masks, thereby to form an n$^+$-type semiconductor region 10. In the step of ion implantation, there are further formed high-concentration layers that serve as the source and drain regions of an n-channel MISFET that constitutes the peripheral circuit. The region where a p-channel MISFET of peripheral circuit will be constituted, is covered with a mask composed of a resist film so that the n-type impurities will not be introduced thereto. The mask composed of the resist film is removed after the ion implantation. After the n-channel MISFET is formed, though not diagramed, the n-channel MISFET region of the peripheral circuit and the memory cell region are covered with a mask composed of a resist film, and p-type impurities such as boron ions are introduced by ion implantation into the p-channel MISFET region of peripheral circuit in order to form the source and drain regions of the p-channel MISFET. The resist film covering the n-channel MISFET and the memory cell region is removed after the p-type impurities are introduced.

With reference to FIG. 20, an insulating film 14 composed of a PSG film is formed by, for example, CVD on the whole surface of the semiconductor substrate 1. Then, there are formed the contact holes 15, the respective data lines DL composed of aluminum film shown in FIGS. 1 and 2, and a final protection film that is not diagramed.

According to the fabrication method of this embodiment as described above, the memory cell can be formed through nearly the same steps for forming the n-channel MISFET that constitutes the peripheral circuit.

Figure 21:
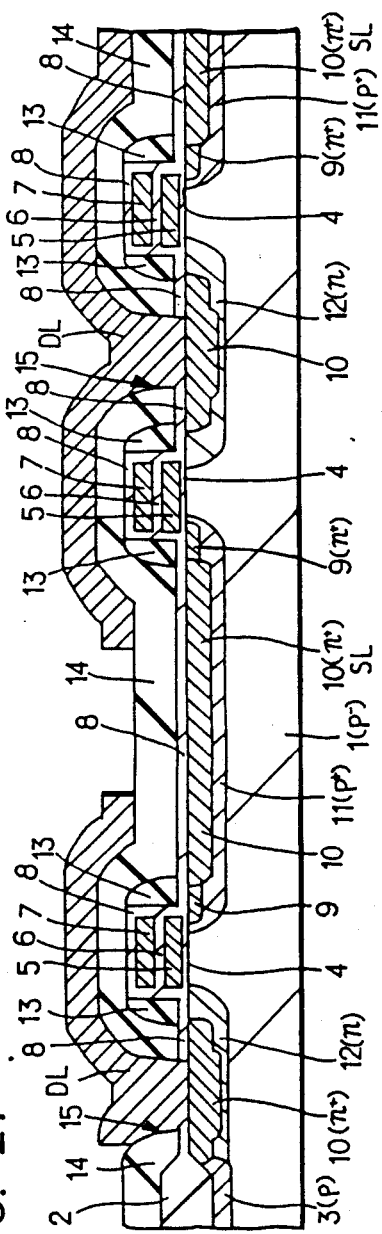
FIGS. 21 to 24 are section views illustrating other memory cells of the present invention.

The drain at the time of reading the data may be constituted by the n$^+$-type semiconductor region 10 and the n-type semiconductor region 12 as shown in FIG. 21. The concentration of impurities (phosphorus ions) in the n-type semiconductor region 12 is from $10^{19}$ to atoms/cm$^2$. This makes it possible to greatly loosen the gradient of concentration of impurities in the drain during the reading operation and to increase the junction breakdown voltage of the drain. The junction depths and structures of the semiconductor regions are the same as those of the aforementioned embodiment.

Figure 22:
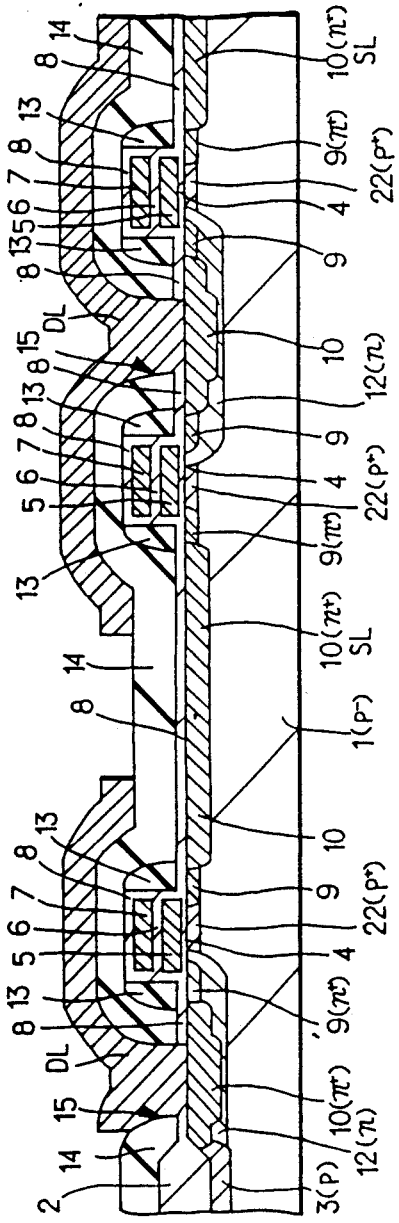

FIG. 22 is a section view of the memory cell according to a further embodiment of the present invention.

In this embodiment, the p$^+$-type semiconductor region 11 is not formed under the n$^+$-type semiconductor regions 9, 10 that constitute the grounding line SL, and a p$^+$-type semiconductor region 22 is formed in the channel region. The p$^+$-type semiconductor region 22 is provided in contact with the n-type semiconductor region 12 that constitutes the drain during the reading operation and in contact with the n$^+$-type semiconductor region 9 that constitutes the grounding line SL. The concentration of impurities (boron ions) in the p$^+$-type semiconductor region 22 is about $10^{12}$ to $10^{13}$ atoms/cm$^2$.

In the device of this structure, the junction breakdown voltage relative to the semiconductor substrate 1 is increased by the n-type semiconductor region 12. Further, the p$^+$-type semiconductor region 22 helps intensify the electric field applied to the end of the drain region when the data is to be written. On the other hand, the junction capacitance of the grounding line SL can be reduced relative to the semiconductor substrate 1.

Figure 23:
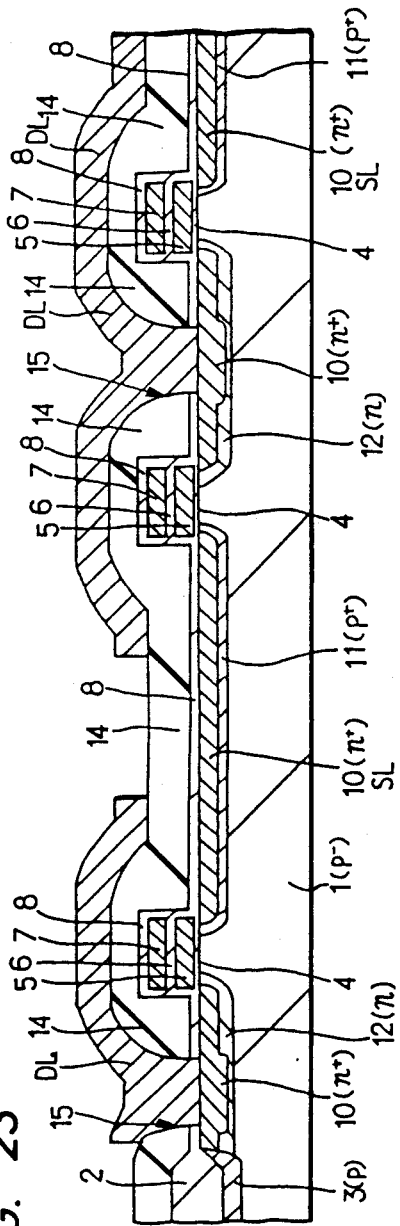

FIG. 23 is a section view of the memory cell according to a still further embodiment of the present invention.

According to this embodiment, the drain during the reading operation is constituted by the n$^+$-type semiconductor region 10 and n-type semiconductor region 12 alone, and the grounding line SL (source) is constituted by the n$^+$-type semiconductor region 10 alone. The junction depth of the n$^+$-type semiconductor region 10 of the drain and the grounding line SL is about 0.3 μm, so that it reliably extends under the floating gate electrode 5. Therefore, the quantity of overlapping is stabilized relative to the floating gate electrode 5, and the data writing characteristics and the data erasing characteristics are improved. The n$^+$-type semiconductor region 10 that constitutes the grounding line SL is provided in the p$^+$-type semiconductor region 11 to improve the writing efficiency.

Figure 24:
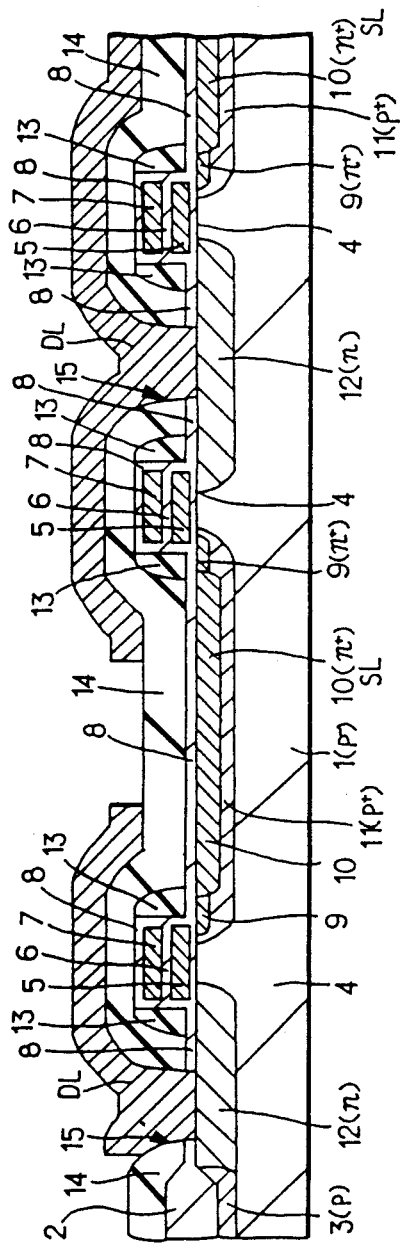
Figure 25:
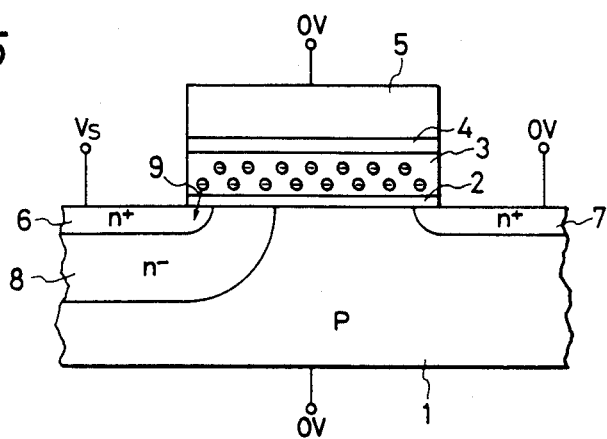
FIGS. 25 and 26 are section views of a memory cell for explaining the problems inherent in the conventional erasing system.
Figure 26:
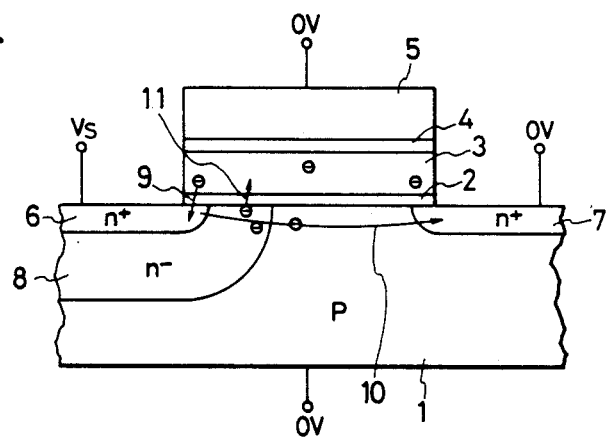
Figure 27:
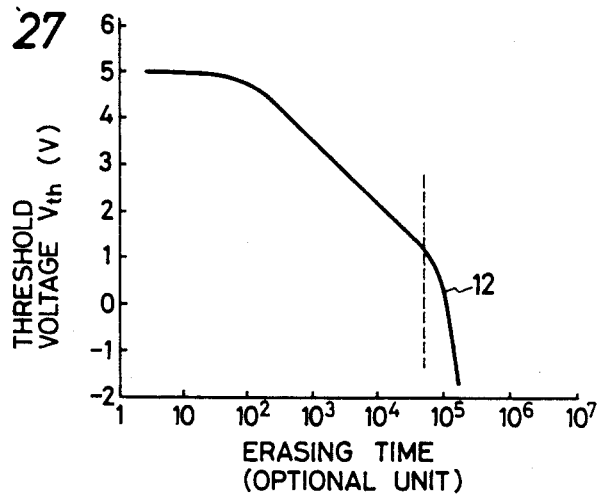
FIG. 27 is a diagram of erasing characteristics by the conventional technique of erasing.

FIG. 24 is a section view of the memory cell according to a yet further embodiment of the present invention.

In this embodiment, the drain during the reading operation is constituted by the n-type semiconductor region 12 alone. This structure makes it possible to reduce the quantity of overlapping between the drain during the reading operation and the floating electrode 5. This enables the data reading speed to be increased.

Among the inventive aspects disclosed in the present application, effects of the representative examples will be described below briefly.

That is, there is provided a semiconductor memory device in which a memory cell consists of a MISFET which is constituted by a floating gate electrode and a control gate electrode formed on a substrate in a superposed manner, a first semiconductor region provided on an end side of the gate electrodes to which is connected the data line on the surface of the substrate, and an opposing end second semiconductor region formed on a side of the gate electrodes to which the grounding line is connected, the MISFET being arranged at the intersecting portions of the data lines and the word lines, and wherein the first semiconductor region of the MISFET is connected to the data line, the second semiconductor region is connected to the grounding line, and the control gate electrode is connected to the word line. The impurity concentration in the first semiconductor region is set to be lower than that of the second semiconductor region. To write the data, a predetermined high potential is applied to the second semiconductor region to which the grounding line is connected, a predetermined low potential is applied to the first semiconductor region to which the data line is connected, and a predetermined high potential is applied to the control gate electrode. To read the data a predetermined potential is applied to the control gate electrode using the first semiconductor region to which the data line is connected as a drain and using the second semiconductor region to which the grounding line is connected as a source. Therefore, the electric field becomes strong at an end of the drain, i.e., at an end of the region which is closer to the channel side of that region connected to the grounding line SL during the writing operation, thereby enabling the writing characteristics to be improved. Furthermore, the junction capacitance decreases between the substrate and the drain, i.e., n-type semiconductor region during the reading operation, thereby enabling the reading speed to be increased.

There is provided a semiconductor memory device in which a memory cell consists of a MISFET which is constituted by a floating gate electrode and a control gate electrode formed on a substrate in a superposed manner, a first semiconductor region provided on an end side of the gate electrodes to which is connected the data line on the surface of the substrate, and a second semiconductor region formed on the end side of the gate electrodes, i.e. an opposing end side to which the grounding line is connected, the MISFET being arranged at the intersecting portions of the data lines and the word lines, the second semiconductor region is connected to the grounding line, and the control gate electrode is connected to the word line. Further, a third semiconductor region is provided at an end of the second semiconductor region on the channel side, the third semiconductor region having a conductivity type opposite to that of the first and second semiconductor regions. To write the data, a predetermined high potential is applied to the second semiconductor region to which the grounding line is connected, a predetermined low potential is applied to the first semiconductor region to which the data line is connected, and a predetermined high potential is applied to the control gate electrode. To read the data, a predetermined potential is applied to the control gate using the first semiconductor region as a drain and using the second semiconductor region to which the grounding line is connected as a source. Therefore, the electric field becomes very strong at an end of the drain, i.e., becomes stronger at an end of the grounding line on the channel side when the third semiconductor region is provided than that when the third semiconductor region is not provided, thereby enabling the writing characteristics to be improved. Further, since the junction capacitance decreases between the substrate and the drain, i.e., n-type semiconductor region during the reading operation, the reading speed can be increased.

There is further provide a semiconductor memory device in which a memory cell consists of a MISFET which is constituted by a floating gate electrode and a control gate electrode formed on a substrate in a superposed manner, a first semiconductor region provided on an end side of the gate electrodes to which is connected the data line on the surface of the substrate, and a second semiconductor region formed on an opposing end side of the gate electrodes to which the grounding line is connected, the MISFET being arranged at the intersecting portions of the data lines and the word lines, and wherein the first semiconductor region is connected to the data line, the second semiconductor region is connected to the grounding line, and the control gate electrode is connected to the word line. Further, a third semiconductor region is provided at an end of the second semiconductor region on the channel side, the third semiconductor region having a conductivity type opposite to that of the first and second semiconductor regions. To write the data, a predetermined high potential is applied to the second semiconductor region to which the grounding line is connected, a predetermined low potential is applied to the first semiconductor region to which the data line is connected, and a predetermined high potential is applied to the control gate electrode. To read the data, a predetermined potential is applied to the control gate electrode using the first semiconductor region as a drain and using the second semiconductor region to which the grounding line is connected as a source. Therefore, the electric field becomes very strong at an end of the drain, i.e., at an end of the grounding line on the channel side during the writing operation than that of when the third semiconductor region is not provided, thereby enabling the writing characteristics to be improved. Furthermore, since the junction capacitance becomes small between the substrate and the drain, i.e., n-type semiconductor region, the reading operation can be increased.

The invention has been specifically described above by way of embodiments. It should, however, be noted that the present invention is in no way limited to the aforementioned embodiments only, but can be modified in a variety of other ways without departing from the spirit and scope of the invention.

What is claimed is:

1. A semiconductor memory device which comprises:

a semiconductor substrate of a first type of conductivity having an upper main surface; and a memory cell including a MISFET which is constituted by a floating gate electrode and a control gate electrode provided thereover in a superposed manner on said substrate, a first gate insulating film formed between an upper main surface of said semiconductor substrate and said floating gate electrode, a second gate insulating film formed between said floating gate electrode and said control gate electrode, a first semiconductor region of a second type of conductivity being provided near a first end side of said superposed floating and control gate electrodes and in a portion of said semiconductor substrate near said upper main surface to which is electrically coupled a corresponding data line, and a second semiconductor region of said second type of conductivity provided near a second opposing end side of said superposed floating and control gate electrodes and in a different portion of said semiconductor substrate near said upper main surface to which a grounding line is connected, said first semiconductor region and said second semiconductor region being respectively disposed such that a corresponding channel region is effected therebetween and which channel region is beneath said superposed floating and control gate electrodes, said MISFET being arranged at an intersecting portion of a respective data line and a respective word line of an intersecting arrangement of word and data lines, said grounding line being electrically coupled to said second semiconductor region and extending in the same direction as said word line, said control gate electrode being electrically coupled to said word line, said first semiconductor region being electrically coupled to said data line, and an impurity concentration in said first semiconductor region being lower than an impurity concentration in said second semiconductor region; and wherein data is written onto said memory cell by applying a predetermined high potential to said second semiconductor region to which said grounding line is electrically coupled, applying a predetermined low potential to said first semiconductor region to which said data line is electrically coupled, applying a predetermined high potential to said control gate electrode, and wherein data is read out therefrom by applying a predetermined potential to said control gate electrode using said first semiconductor region to which said data line is electrically coupled as a drain and using said second semiconductor region to which said grounding line is electrically coupled as a source.

2. A semiconductor memory device according to claim 1, wherein said first and second types of conductivity are the p-type and the n-type, respectively.

3. A semiconductor memory device according to claim 1, wherein the data is erased from said memory cell by applying a predetermined high potential to said first semiconductor region to which said data line is electrically coupled, applying a predetermined low potential to said second semiconductor region to which said grounding line is electrically coupled, and applying a predetermined low potential to said control gate electrode.

4. A semiconductor memory device according to claim 1, wherein the data is erased from said memory cell by the irradiation of ultraviolet rays.

5. A semiconductor memory device according to claim 1, wherein said first semiconductor region further includes a third semiconductor region that is formed therein through the same step of forming said second semiconductor region.

6. A semiconductor memory device according to claim 1, wherein said second semiconductor region is comprised of a pair of regions, one region of said pair of regions has a junction depth from said upper main surface which is shallower than the junction depth corresponding to the other of said pair of regions, and wherein said one region is formed between said channel region and said other one of said pair of regions.

7. A semiconductor memory device according to claim 6, wherein said one region has a junction depth of about 0.1 to 0.2 $\mu$m and said other one of said pair of regions has a junction depth of about 0.2 to 0.3 $\mu$m, said one region corresponding to an end portion of said second semiconductor region on the side adjacent to said channel region.

8. A semiconductor memory device according to claim 1, wherein said first semiconductor region has a junction depth of about 0.4 to 0.6 $\mu$m.

9. A semiconductor memory device according to claim 1, wherein said first semiconductor region is so formed as to include therein a third semiconductor region which has a junction depth from said upper main surface of about 0.2 to 0.3 $\mu$m and which is so formed so as to not extend orthogonally under the insulatedly disposed said superposed floating and control gate electrodes, and wherein said second semiconductor region is comprised of a fourth semiconductor region corresponding to an end portion of said second semiconductor region which is adjacent to said channel region and a fifth semiconductor region of a portion separated away from said channel region.

10. A semiconductor memory device according to claim 1, wherein said first semiconductor region has a junction depth of 0.4 to 0.6 $\mu$m from said upper main surface, said first semiconductor region having formed therein a third semiconductor region which has a junction depth from said upper main surface of about 0.3 $\mu$m, and wherein said second semiconductor region has a junction depth from said upper main surface of about 0.3 $\mu$m.

11. A semiconductor memory device according to claim 1, wherein said first semiconductor region has a junction depth from said upper main surface of about 0.4 to 0.6 $\mu$m, and wherein said second semiconductor region is comprised of a third semiconductor region having a junction which is as shallow as about 0.1 to 0.2 82 m from said upper main surface corresponding to an end portion of said second semiconductor region which has a junction of about 0.2 to 0.3 $\mu$m from said upper main surface which forms a portion separated away from the channel region.

12. A semiconductor memory device according to claim 1, wherein data is erased from said memory cell by placing said second semiconductor region under an electrically floating condition at the time of extracting the electric charge stored in said floating gate electrode by applying a predetermined potential to said first semiconductor region via said data line.

13. A semiconductor memory device according to claim 1, wherein data is erased from said memory cell by applying a predetermined substantially equal potential to both said first semiconductor region and said second semiconductor region via said data line and said ground line, respectively, so that the electric charge stored in said floating gate electrode is absorbed by said first and second semiconductor regions.

14. A semiconductor memory device which comprises:
    a semiconductor substrate of a first type of conductivity; and
    a memory cell including a MISFET which is constituted by a floating gate electrode and a control gate electrode provided in a superposed manner insulatedly above an upper main surface of said semiconductor substrate, a first gate insulating film formed between the upper surface of said semiconductor substrate and said floating gate electrode and a second gate insulating film formed between said floating gate electrode and said control gate electrode, a first semiconductor region of a second type of conductivity being provided near a first end side of said superposed floating and control gate electrodes and in a portion of said semiconductor substrate near the upper main surface thereof to which is coupled a corresponding data line, and a second semiconductor region of said second type of conductivity provided near a second opposing end side of said superposed floating and control gate electrodes and in a different portion of said semiconductor substrate near said upper main surface thereof to which a grounding line is connected, said first semiconductor region and said second semiconductor region being disposed such that a corresponding channel region is effected therebetween and which channel region is beneath said superposed floating and control gate electrodes, said MISFET being arranged at an intersecting portion of a respective data line and a respective word line of an intersecting arrangement of word and data lines, said first semiconductor region thereof being electrically coupled to said data line, said second semiconductor region thereof being electrically coupled to said grounding line which extends in the same direction as said word line, said control gate electrode thereof being electrically coupled to the word line, said first semiconductor region having an impurity concentration selected to be lower than that of said second semiconductor region, said MISFET further including a third semiconductor region of said first conductivity type being provided so as to contact at least an end portion of said second semiconductor region on the channel side thereof;

wherein data is written onto said memory cell by applying a predetermined high potential to said second semiconductor region to which said grounding line is electrically coupled, applying a predetermined low potential to said first semiconductor region to which said data line is electrically coupled, and applying a predetermined high potential to said control gate electrode, wherein data is read out from said memory cell by applying a predetermined potential to said control gate electrode using said first semiconductor region to which said data line is electrically coupled as a drain and using said second semiconductor region to which said grounding line is electrically coupled as a source, and wherein data is erased from said memory cell by applying a predetermined high potential to said first semiconductor region to which said data line is electrically coupled, applying a predetermined low potential to said second semiconductor region to which said grounding line is electrically coupled, and applying a predetermined low potential to said control gate electrode.

15. A semiconductor memory device according to claim 14, wherein said first and second types of conductivity are the p-type and the n-type, respectively.

16. A semiconductor memory device according to claim 14, wherein said first semiconductor region contains a fourth semiconductor region therein that is formed through the same step of forming said second semiconductor region.

17. A semiconductor memory device according to claim 14, wherein said first semiconductor region has formed therein fourth and fifth semiconductor regions and said second semiconductor region is comprises of sixth and seventh semiconductor regions, said fifth and seventh regions having a junction depth which is as shallow as about 0.1 to 0.2 μm from said upper main surface wherein each is formed at an end portion thereof on a respective channel side, said fourth and sixth semiconductor regions each having a junction depth of about 0.2 to 0.3 μm, and wherein said sixth and seventh semiconductor regions constituting said second semiconductor region have their peripheries and lower surfaces thereof surrounded by said third semiconductor region.

18. A semiconductor memory device according to claim 14, wherein said first semiconductor region, to which the data line is electrically coupled, further includes a fourth semiconductor region having a junction depth of about 0.2 to 0.3 μm in said semiconductor substrate from said main surface thereof in such a manner that it will not extend under said floating gate electrode and said control gate electrode, and said second semiconductor region to which the grounding line is electrically coupled is comprised of a fifth semiconductor region corresponding to an end portion of said second semiconductor region which is on a corresponding side of the channel region and by a sixth semiconductor region that is separated away from the channel.

19. A semiconductor memory device according to claim 14, wherein said first semiconductor region has a junction depth of about 0.4 to 0.6 μm from said upper main surface and has formed therein a fifth semiconductor region having a junction depth from said upper main surface of about 0.3 μm, and wherein said second semiconductor region has a junction depth of about 0.3 μm from said upper main surface.

20. A semiconductor memory device according to claim 17, wherein said first semiconductor region consists solely of a low impurity concentration region which has a junction depth of about 0.4 to 0.6 μm from said upper main surface, and wherein said second semiconductor region is comprised of fourth semiconductor region having a junction depth of as shallow as about 0.1 to 0.2 μm from said upper main surface at an end portion of said second semiconductor region on a corresponding channel side thereof and a fifth semiconductor region which has a junction depth of about 0.2 to 0.3 μm from said upper main surface and which is separated away from the channel region.

21. A semiconductor memory device according to claim 14, wherein said first semiconductor region includes at least a low impurity concentration region which has a depth of about 0.4 to 0.6 μm from said upper main surface, and wherein said second semiconductor region is comprised of a fourth semiconductor region having a junction depth, from said upper main surface, of about 0.1 to 0.2 μm and which is formed at an end portion of said second semiconductor region adjacent the channel side thereof and a fifth semiconductor region which has a junction depth of about 0.2 to 0.3 μm from said upper main surface and which is separated from the channel by said fourth semiconductor region.

22. A semiconductor memory device according to claim 14, wherein said second semiconductor region is comprised of fourth and fifth heavily doped semiconductor regions, said fourth semiconductor region having a junction depth which is relatively shallow with respect to that of said first and fifth semiconductor regions, and wherein said third semiconductor region is formed so as to be in contact with at least said fourth semiconductor region.

23. A semiconductor memory device according to claim 22, wherein said third semiconductor region is formed so as to surround and be in contact with the peripheries and lower surfaces of said fourth and fifth semiconductor region.

24. A semiconductor memory device according to claim 23, wherein said fourth and fifth semiconductor regions have a junction depth from said upper main surface of about 0.1 to 0.2 μm and 0.2 to 0.3 μm, respectively, and wherein said fourth semiconductor region corresponds to an end portion of said second semiconductor region which is adjacent said channel region and said fifth semiconductor region which is contiguous with said fourth semiconductor region is separated from said channel region by said fourth semiconductor region.

25. A semiconductor memory device according to claim 24, wherein said third semiconductor region has a junction depth which corresponds to the junction depth of said first semiconductor region, and wherein said second semiconductor region is a region which is formed in said third semiconductor region.

26. A semiconductor memory device which comprises:
    a semiconductor substrate of a first type of conductivity; and
    a memory cell consisting of a MISFET which is comprised of a floating gate electrode and a control gate electrode provided on said substrate in a superposed manner, a first gate insulating film formed between an upper main surface of said semiconductor substrate and said floating gate electrode, a second gate insulating film formed between said floating gate electrode and said control gate electrode, a first semiconductor region of a second type of conductivity being provided near a first end side of said superposed floating and control gate electrodes and in a portion of said semiconductor substrate near said upper main surface to which is electrically coupled a corresponding data line, a second semiconductor region of said second type of conductivity being provided near a second opposing end side of said superposed floating and control gate electrodes and in a different portion of said semiconductor substrate near said upper main surface to which said grounding line is connected, and a third semiconductor region of said first conductivity type being formed so as to contact at least an end portion of said second semiconductor region on a channel side, said MISFET being arranged at an intersecting portion of a respective data line and a respective word line of an intersecting arrangement of word and data lines, said first semiconductor region being electrically coupled to said data line, and said second semiconductor region being electrically coupled to said grounding line that extends in the same direction as said word line; and
    wherein data is written onto said memory cell by applying a predetermined high potential to said second semiconductor region to which said grounding line is connected, applying a predetermined low potential to said first semiconductor region to which said data line is connected, and applying a predetermined high potential to said control gate electrode, and data is read out from said memory cell by applying a predetermined potential to said control gate electrode using said first semiconductor region to which said data line is connected as a drain and using said second semiconductor region to which said grounding line is connected as a source.

27. A semiconductor memory device according to claim 26, wherein said first and second types of conductivity are the p-type and the n-type, respectively.

28. A semiconductor memory device according to claim 26, wherein said third semiconductor region is a $p^+$-type semiconductor region.

29. A semiconductor memory device according to claim 26, wherein data is erased from said memory cell by applying a predetermined high potential to said first semiconductor region via said data line, applying a predetermined low potential to the second semiconductor region via said grounding line, and applying a predetermined low potential to said control gate electrode.

30. A semiconductor memory device according to claim 26, wherein data is erased from said memory cell by the irradiation of ultraviolet rays.

31. A semiconductor memory device according to claim 26, wherein said first semiconductor region includes fourth and fifth semiconductor regions and said second semiconductor region includes sixth and seventh semiconductor regions, said fifth and seventh semiconductor regions having a shallow junction depth of about 0.1 to 0.2 μm from said upper main surface wherein each is formed at an end portion thereof on a respective channel side, and said fourth and sixth semiconductor regions having junction depths of about 0.2 to 0.3 μm from said upper main surface.

32. A semiconductor memory device according to claim 26, wherein said third semiconductor region is formed in a channel region only and is in contact with said second semiconductor region.

33. A semiconductor memory device according to claim 26, wherein said first semiconductor region has formed therein fourth and fifth semiconductor regions.

34. A semiconductor memory device according to claim 33, wherein said fourth and fifth semiconductor regions have a higher impurity concentration than the remainder of said first semiconductor region.

35. A semiconductor memory device according to claim 26, wherein said first and second semiconductor regions have junction depths from said upper main surface of about 0.4 to 0.6 μm and 0.3 μm, respectively.

36. A semiconductor device comprising:
    a semiconductor substrate having a principal surface;
    a memory cell including a MISFET and being formed in a principal surface region of said semiconductor substrate, said MISFET having a floating gate electrode disposed over a channel forming region, of a first conductivity type, in said principal surface region, a control gate electrode being disposed over said floating gate electrode, and first and second semiconductor regions of a second conductivity type, respectively, being formed in said principal surface region, said first semiconductor region being disposed in said principal surface region near a first end side of said floating gate electrode and said second semiconductor region being disposed in said principal surface region, at a different part thereof, near a second opposing end side of said floating gate electrode, said first semiconductor region having a portion thereof which is in contact with said channel region, said second semiconductor region having a portion thereof which is in contact with said channel region and which portion has a higher impurity concentration than the impurity concentration of said portion of said first semiconductor region;
    a data line being electrically coupled with said first semiconductor region and being coupled with a sense amplifier circuit;

a word line being electrically coupled with said control gate electrode;

a grounding line being electrically coupled with said second semiconductor region; and applying means, being coupled with said grounding line and said word line, for applying, substantially at the same time, predetermined high potentials to said second semiconductor region and said control gate electrode, respectively, which potentials are higher than a potential being applied to said first semiconductor region at said time.

37. A semiconductor device according to claim 36, wherein said first conductivity type is p-type, and said second conductivity type is n-type.

38. A semiconductor device according to claim 36, wherein said first semiconductor region has formed therein a third semiconductor region, of said second conductivity type, which has substantially the same impurity concentration as that of said second semiconductor region.

39. A semiconductor device according to claim 36, wherein said memory cell constitutes a memory cell of an electrically erasable programmable read-only memory (EEPROM).

40. A semiconductor device according to claim 39, wherein said applying means applies said predetermined high potentials to said second semiconductor region and said control gate electrode in a writing operation.

41. A semiconductor device according to claim 40, including a write/erase circuit means wherein during an erasing operation of said EEPROM in connection with a selected memory cell which corresponds to respective word and data lines and to a grounding line, said write/erase circuit means applies a predetermined high potential to said data line and a relatively low potential to both said grounding line and said word line.

42. A semiconductor device according to claim 41, wherein said relatively low potential is at about ground potential.

43. A semiconductor device according to claim 41, wherein during a reading operation of said EEPROM in connection with a selected memory cell thereof, said applying means provides a predetermined potential to said control gate electrode using said first semiconductor region to which said data line is electrically coupled as a drain and using said second semiconductor region to which said grounding line is electrically coupled as a source.

44. A semiconductor device comprising:

a semiconductor substrate having a principal surface;

a memory cell including a MISFET and being formed in a principal surface region of said semiconductor substrate, said MISFET having a floating gate electrode disposed over a channel forming region, of a first conductivity type, in said principal surface region, a control gate electrode being disposed over said floating gate electrode, first and second semiconductor regions of a second conductivity type, respectively, being formed in said principal surface region, said first semiconductor region being disposed in said principal surface region near a first end side of said floating gate electrode and said second semiconductor region being disposed in said principal surface region, at a different part thereof, near a second opposing end side of said floating gate electrode, wherein said MISFET further includes a third semiconductor region of said first conductivity type disposed at least between said channel forming region and said second semiconductor region, the impurity concentration of said third semiconductor region being higher than that of said channel forming region;

a data line being electrically coupled with said first semiconductor region and being coupled with a sense amplifier circuit;

a word line being electrically coupled with said control gate electrode;

a grounding line being electrically coupled with said second semiconductor region; and an applying means, being coupled with said grounding line and said word line, for applying, substantially at the same time, predetermined high potentials to said second semiconductor region and said control gate electrode, respectively, which potentials are higher than a potential being applied to said first semiconductor region at said time.

45. A semiconductor device according to claim 44, wherein said first conductivity type is p-type, and said second conductivity type is n-type.

46. A semiconductor device according to claim 44, wherein said memory cell constitutes a memory cell of an electrically erasable programmable read-only memory (EEPROM).

47. A semiconductor device according to claim 46, wherein said applying means applies said predetermined high potentials to said second semiconductor region and said control gate electrode in a writing operation.

48. A semiconductor device according to claim 47, wherein said semiconductor device further comprises a second applying means, connected with said data line, for applying a predetermined low potential to said first semiconductor region in said writing operation.

49. A semiconductor device according to claim 44, wherein said first semiconductor region has an impurity concentration which is substantially equal to the impurity concentration of said second semiconductor region.

50. A semiconductor device according to claim 49, wherein said memory cell MISFET further comprises a fourth semiconductor region, of said second conductivity type, being disposed in said principal surface region at least between said channel forming region and said first semiconductor region, and wherein the impurity concentration of said fourth semiconductor region is lower than the impurity concentration of said first semiconductor region.

51. A semiconductor device according to claim 49, wherein said first semiconductor region includes a fourth and fifth semiconductor regions and said second semiconductor region includes sixth and seventh semiconductor regions, wherein said fourth and sixth semiconductor regions have junction depths from said principal surface greater than the junction depths of said fifth and seventh semiconductor regions, respectively, and wherein said fifth and seventh semiconductor regions are formed between said fourth and sixth semiconductor regions, respectively, and a corresponding side of said channel forming region.

52. A semiconductor device according to claim 51, wherein said memory cell MISFET further comprises an eighth semiconductor region of said second conductivity type, being disposed in said principal surface region at least between said channel forming region and said first semiconductor region, and wherein the impurity concentration of said eighth semiconductor region is lower than the impurity concentration of said first semiconductor region.

53. A semiconductor device according to claim 44, wherein the impurity concentration of said first semiconductor region is lower than that of said second semiconductor region.

54. A semiconductor device according to claim 53, wherein said first semiconductor region contains a fourth semiconductor region, of said second conductivity type, which has an impurity concentration which is substantially the same as that of said second semiconductor region.

55. A semiconductor device according to claim 44, wherein said third semiconductor region is disposed so as to extend below an underside of said second semiconductor region in said semiconductor substrate.

56. A semiconductor device having an electrically erasable programmable read-only memory (EEPROM), said semiconductor device comprising:
   a semiconductor substrate having a principal surface;
   a memory cell of said EEPROM including a MISFET and being formed in a principal surface region of said semiconductor substrate, said MISFET having a floating gate electrode disposed over a channel forming region, of a first conductivity type, in said principal surface region, a control gate electrode being disposed over said floating gate electrode, first and second semiconductor regions of a second conductivity type, respectively, being formed in said principal surface region, said first semiconductor region being disposed in said principal surface region near a first end side of said floating gate electrode and said second semiconductor region being disposed in said principal surface region, at a different part thereof, near a second opposing end side of said floating gate electrode, wherein said MISFET further includes a third semiconductor region of said first conductivity type disposed at least between said channel forming region and said second semiconductor region, the impurity concentration of said third semiconductor region being higher than that of said channel forming region;
   a data line being electrically coupled with said first semiconductor region and being coupled with a sense amplifier circuit;
   a word line being electrically coupled with said control gate electrode;
   a grounding line being electrically coupled with said second semiconductor region;
   a first applying means, being coupled with said grounding line and said word line, for applying predetermined high potentials to said second semiconductor region and said control gate electrode, respectively, in a writing operation; and
   a second applying means, being coupled to said data line, for applying to said first semiconductor region, in said writing operation, a potential lower than said predetermined high potentials.

* * * * *